(12) United States Patent
Nakamura et al.

(10) Patent No.: US 12,557,278 B2
(45) Date of Patent: Feb. 17, 2026

(54) THREE-DIMENSIONAL MEMORY DEVICE INCLUDING VARIABLE THICKNESS SEMICONDUCTOR CHANNELS AND METHOD OF FORMING THE SAME

(71) Applicant: SANDISK TECHNOLOGIES LLC, Addison, TX (US)

(72) Inventors: Tadashi Nakamura, Yokkaichi (JP); Nobuyuki Fujimura, Yokkaichi (JP)

(73) Assignee: Sandisk Technologies, Inc., Milpitas, CA (US)

(*) Notice: Subject to any disclaimer, the term of this patent is extended or adjusted under 35 U.S.C. 154(b) by 709 days.

(21) Appl. No.: 17/811,145

(22) Filed: Jul. 7, 2022

(65) Prior Publication Data
US 2024/0015963 A1 Jan. 11, 2024

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 41/20; H10B 41/27; H10B 41/30; H10B 41/35; H10B 41/42; H10B 41/44; H10B 41/48; H10B 43/20; H10B 43/27; H10B 43/30; H10B 43/35; H10B 43/50; G11C 16/0408; H01L 27/0688; H01L 27/2481; H01L 27/1052; H01L 27/11551; H01L 27/11578; H01L 27/11582; H01L 27/11556; H01L 27/11524; H01L 29/04; H01L 29/16; H01L 29/4234; H01L 29/42352; H01L 29/511; H01L 29/518; H01L 29/66825; H01L 29/66833; H01L 29/7883; H01L 29/792; H01L 29/7926; H01L 29/1033; H01L 23/528;
(Continued)

(56) References Cited

U.S. PATENT DOCUMENTS 8,658,499 B2 2/2014 Makala et al.
9,230,987 B2 1/2016 Pachamuthu et al.
(Continued)

OTHER PUBLICATIONS

ISR—Notification of Transmittal of The International Search Report and Written Opinion of the International Searching Authority for International Patent Application No. PCT/US2023/024092, mailed Sep. 20, 2023, 8 pages.
(Continued)

*Primary Examiner* — Natalia A Gondarenko
(74) *Attorney, Agent, or Firm* — THE MARBURY LAW GROUP PLLC

(57) ABSTRACT

A semiconductor structure includes an alternating stack of insulating layers and electrically conductive layers, where the electrically conductive layers include word line electrically conductive layers and a first select-level electrically conductive layer, a memory opening vertically extending through the alternating stack, and a memory opening fill structure located in the memory opening and including a memory film and a vertical semiconductor channel. A vertical cross-sectional profile of an outer sidewall of the vertical semiconductor channel is straight throughout the word line electrically conductive layers and contains a lateral protrusion at a level of the first select-level electrically conductive layer.

19 Claims, 25 Drawing Sheets

(58) Field of Classification Search
CPC ............. H01L 23/5283; H01L 23/5329; H01L 27/11565; H01L 27/11568; H01L 27/11519; H01L 27/1157; H01L 27/115; H01L 27/11597
USPC .................................. 257/329, 314, 318, 506
See application file for complete search history.

(56) References Cited

U.S. PATENT DOCUMENTS

| | | | |
|---|---|---|---|
| 9,252,151 B2 | 2/2016 | Chien et al. | |
| 9,356,031 B2 | 5/2016 | Lee et al. | |
| 9,397,093 B2 | 7/2016 | Makala et al. | |
| 9,412,749 B1 | 8/2016 | Shimabukuro et al. | |
| 9,419,012 B1 | 8/2016 | Shimabukuro et al. | |
| 9,524,982 B2* | 12/2016 | Kamigaichi | H10B 43/27 |
| 9,576,967 B1 | 2/2017 | Kimura et al. | |
| 9,576,975 B2 | 2/2017 | Zhang et al. | |
| 9,620,514 B2 | 4/2017 | Kai et al. | |
| 9,627,399 B2 | 4/2017 | Kanakamedala et al. | |
| 9,659,955 B1 | 5/2017 | Sharangpani et al. | |
| 9,659,956 B1 | 5/2017 | Pachamuthu et al. | |
| 9,666,594 B2 | 5/2017 | Mizuno et al. | |
| 9,691,884 B2 | 6/2017 | Makala et al. | |
| 9,728,546 B2 | 8/2017 | Serov et al. | |
| 9,754,963 B1 | 9/2017 | Kawamura et al. | |
| 9,837,431 B2 | 12/2017 | Nishikawa et al. | |
| 9,853,038 B1 | 12/2017 | Cui | |
| 9,870,945 B2 | 1/2018 | Pachamuthu et al. | |
| 9,875,929 B1 | 1/2018 | Shukla et al. | |
| 9,881,929 B1 | 1/2018 | Ravikirthi et al. | |
| 9,905,573 B1 | 2/2018 | Mada et al. | |
| 9,935,123 B2 | 4/2018 | Nishikawa et al. | |
| 9,935,124 B2 | 4/2018 | Nishikawa et al. | |
| 9,960,180 B1 | 5/2018 | Zhou et al. | |
| 9,978,766 B1 | 5/2018 | Hosoda et al. | |
| 9,985,098 B2 | 5/2018 | Matsumoto et al. | |
| 9,991,277 B1 | 6/2018 | Tsutsumi et al. | |
| 10,008,570 B2 | 6/2018 | Yu et al. | |
| 10,014,316 B2 | 7/2018 | Yu et al. | |
| 10,020,363 B2 | 7/2018 | Ogawa et al. | |
| 10,115,632 B1 | 10/2018 | Masamori et al. | |
| 10,141,331 B1 | 11/2018 | Susuki et al. | |
| 10,192,784 B1 | 1/2019 | Cui et al. | |
| 10,256,245 B2 | 4/2019 | Ariyoshi | |
| 10,269,820 B1 | 4/2019 | Kaminaga | |
| 10,304,852 B1 | 5/2019 | Cui et al. | |
| 10,373,696 B2 | 8/2019 | Zhang et al. | |
| 10,373,969 B2 | 8/2019 | Zhang et al. | |
| 10,381,376 B1* | 8/2019 | Nishikawa | H10D 62/292 |
| 10,381,434 B1 | 8/2019 | Pachamuthu et al. | |
| 10,381,443 B2 | 8/2019 | Matsumoto et al. | |
| 10,475,879 B1 | 11/2019 | Pachamuthu et al. | |
| 10,516,025 B1 | 12/2019 | Nishikawa et al. | |
| 10,559,588 B2 | 2/2020 | Dong et al. | |
| 10,566,059 B2 | 2/2020 | Diep et al. | |
| 10,622,368 B2 | 4/2020 | Kanakamedala et al. | |
| 10,629,613 B1 | 4/2020 | Shimizu et al. | |
| 10,672,780 B1 | 6/2020 | Kawamura et al. | |
| 10,700,078 B1 | 6/2020 | Cui et al. | |
| 10,700,086 B2 | 6/2020 | Makala et al. | |
| 10,700,089 B1 | 6/2020 | Hojo et al. | |
| 10,700,090 B1 | 6/2020 | Cui et al. | |
| 10,720,444 B2 | 7/2020 | Nishikawa et al. | |
| 10,727,248 B2 | 7/2020 | Kaminaga | |
| 10,854,629 B2 | 12/2020 | Ge et al. | |
| 10,892,267 B2 | 1/2021 | Mushiga et al. | |
| 10,937,801 B2 | 3/2021 | Otsu et al. | |
| 10,950,627 B1 | 3/2021 | Hinoue et al. | |
| 10,957,706 B2 | 3/2021 | Otsu et al. | |
| 10,971,514 B2 | 4/2021 | Otsu et al. | |
| 10,985,171 B2 | 4/2021 | Kaneko | |
| 11,018,151 B2 | 5/2021 | Kaneko | |
| 11,049,568 B1* | 6/2021 | Yada | H10B 43/10 |
| 11,049,876 B2 | 6/2021 | Kaminaga et al. | |
| 11,121,153 B1 | 9/2021 | Obu et al. | |
| 11,127,759 B2 | 9/2021 | Obu et al. | |
| 11,201,111 B2 | 12/2021 | Zhao et al. | |
| 11,244,953 B2 | 2/2022 | Kanakamedala et al. | |
| 11,257,835 B2 | 2/2022 | Li et al. | |
| 11,322,440 B2 | 5/2022 | Kubo | |
| 2006/0263963 A1 | 11/2006 | Hu | |
| 2011/0115010 A1 | 5/2011 | Shim et al. | |
| 2011/0298037 A1* | 12/2011 | Choe | H10D 30/0413 257/314 |
| 2014/0087534 A1 | 3/2014 | Choe et al. | |
| 2014/0225181 A1 | 8/2014 | Makala et al. | |
| 2015/0236038 A1 | 8/2015 | Pachamuthu et al. | |
| 2015/0380423 A1 | 12/2015 | Kanakamedela et al. | |
| 2015/0380424 A1 | 12/2015 | Makala et al. | |
| 2016/0043093 A1 | 2/2016 | Lee et al. | |
| 2016/0071860 A1 | 3/2016 | Kai et al. | |
| 2016/0071861 A1 | 3/2016 | Serov et al. | |
| 2016/0071876 A1 | 3/2016 | Mizuno et al. | |
| 2016/0086972 A1 | 3/2016 | Zhang et al. | |
| 2016/0111435 A1 | 4/2016 | Pang et al. | |
| 2016/0111436 A1 | 4/2016 | Ding et al. | |
| 2016/0111437 A1 | 4/2016 | Pang et al. | |
| 2016/0204122 A1 | 7/2016 | Shoji et al. | |
| 2016/0268209 A1 | 9/2016 | Pachamuthu et al. | |
| 2016/0276359 A1 | 9/2016 | Oginoe et al. | |
| 2016/0322374 A1 | 11/2016 | Sano et al. | |
| 2017/0025431 A1 | 1/2017 | Kanakamedala et al. | |
| 2017/0098656 A1 | 4/2017 | Son et al. | |
| 2017/0125436 A1 | 5/2017 | Sharangpani et al. | |
| 2017/0148800 A1 | 5/2017 | Nishikawa et al. | |
| 2017/0148805 A1 | 5/2017 | Nishikawa et al. | |
| 2017/0148808 A1 | 5/2017 | Nishikawa et al. | |
| 2017/0148809 A1 | 5/2017 | Nishikawa et al. | |
| 2017/0236835 A1 | 8/2017 | Nakamura et al. | |
| 2018/0061850 A1 | 3/2018 | Mada et al. | |
| 2018/0108671 A1 | 4/2018 | Yu et al. | |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |
| 2018/0130812 A1 | 5/2018 | Hosoda et al. | |
| 2018/0151588 A1 | 5/2018 | Tsutsumi et al. | |
| 2018/0261613 A1 | 9/2018 | Ariyoshi | |
| 2018/0261671 A1 | 9/2018 | Matsumoto et al. | |
| 2018/0277567 A1 | 9/2018 | Nakamura et al. | |
| 2018/0301374 A1 | 10/2018 | Masamori et al. | |
| 2018/0342531 A1 | 11/2018 | Susuki et al. | |
| 2018/0350879 A1 | 12/2018 | Sel et al. | |
| 2018/0374863 A1 | 12/2018 | Purayath | |
| 2018/0374865 A1 | 12/2018 | Shimabukuro et al. | |
| 2019/0214395 A1 | 7/2019 | Zhang et al. | |
| 2019/0221575 A1 | 7/2019 | Dong et al. | |
| 2019/0252396 A1 | 8/2019 | Mushiga et al. | |
| 2019/0252403 A1 | 8/2019 | Kaminaga et al. | |
| 2019/0252404 A1 | 8/2019 | Kaminaga | |
| 2019/0252405 A1 | 8/2019 | Tsutsumi et al. | |
| 2019/0333581 A1 | 10/2019 | Diep et al. | |
| 2019/0363098 A1 | 11/2019 | Lung | |
| 2019/0371803 A9 | 12/2019 | Kanakamedala et al. | |
| 2019/0386108 A1 | 12/2019 | Nishikawa et al. | |
| 2020/0006375 A1 | 1/2020 | Zhou et al. | |
| 2020/0006376 A1 | 1/2020 | Makala et al. | |
| 2020/0027835 A1 | 1/2020 | Hsu et al. | |
| 2020/0035694 A1 | 1/2020 | Kaminaga | |
| 2020/0058672 A1 | 2/2020 | Nishikawa et al. | |
| 2020/0203362 A1 | 6/2020 | Rabkin et al. | |
| 2020/0219895 A1 | 7/2020 | Mushiga et al. | |
| 2020/0219896 A1 | 7/2020 | Mushiga et al. | |
| 2020/0266206 A1 | 8/2020 | Fukuo et al. | |
| 2020/0312864 A1 | 10/2020 | Iwai et al. | |
| 2020/0328227 A1 | 10/2020 | Kang et al. | |
| 2020/0357815 A1 | 11/2020 | Iwai et al. | |
| 2020/0402905 A1 | 12/2020 | Otsu et al. | |
| 2020/0402992 A1 | 12/2020 | Otsu et al. | |
| 2020/0403005 A1 | 12/2020 | Sakurai et al. | |
| 2021/0005627 A1 | 1/2021 | Hinoue et al. | |
| 2021/0159169 A1 | 5/2021 | Zhao et al. | |
| 2021/0159241 A1 | 5/2021 | Li et al. | |
| 2021/0265372 A1 | 8/2021 | Kanakamedala et al. | |
| 2021/0265379 A1 | 8/2021 | Obu et al. | |

(56) References Cited

U.S. PATENT DOCUMENTS

| | | | |
|---|---|---|---|
| 2021/0265380 A1 | 8/2021 | Obu et al. |
| 2021/0265385 A1 | 8/2021 | Rajashekhar et al. |
| 2021/0358936 A1 | 11/2021 | Takuma et al. |
| 2021/0358937 A1 | 11/2021 | Yamaguchi et al. |
| 2021/0358941 A1 | 11/2021 | Kajiwara et al. |
| 2021/0384206 A1 | 12/2021 | Iwai et al. |
| 2021/0384207 A1 | 12/2021 | Iwai et al. |
| 2022/0005818 A1 | 1/2022 | Tanaka et al. |
| 2022/0005824 A1 | 1/2022 | Tanaka et al. |
| 2022/0052073 A1 | 2/2022 | Kitazawa et al. |
| 2022/0059561 A1 | 2/2022 | Noh |

OTHER PUBLICATIONS

U.S. Appl. No. 17/158,395, filed Jan. 26, 2021, SanDisk Technologies LLC.
U.S. Appl. No. 17/192,463, filed Mar. 4, 2021, SanDisk Technologies LLC.
U.S. Appl. No. 17/233,799, filed Apr. 19, 2021, SanDisk Technologies LLC.
U.S. Appl. No. 17/244,456, filed Apr. 29, 2021, SanDisk Technologies LLC.
U.S. Appl. No. 17/351,720, filed Jun. 18, 2021, SanDisk Technologies LLC.
U.S. Appl. No. 17/485,949, filed Sep. 27, 2021, SanDisk Technologies LLC.
U.S. Appl. No. 17/806,592, filed Jun. 13, 2022, SanDisk Technologies LLC.
IPRP—Notification Concerning Transmittal of International Preliminary Report on Patentability and Written Opinion of the International Searching Authority for International Patent Application No. PCT/US2023/024092, mailed. Jan. 16, 2025, 7 pages.
Endoh et al., "Novel Ultra High Density Memory with a Stacked-Surrounding Gate Transistor (S-SGT) Structured Cell," IEDM Proc. (2001) 33-36.
U.S. Appl. No. 16/597,560, filed Nov. 27, 2019, SanDisk Technologies LLC.
U.S. Appl. No. 16/828,129, filed Mar. 24, 2020, SanDisk Technologies LLC.
U.S. Appl. No. 16/832,320, filed Mar. 27, 2020, SanDisk Technologies LLC.
U.S. Appl. No. 16/582,262, filed Sep. 25, 2019, SanDisk Technologies LLC.
U.S. Appl. No. 16/794,536, filed Feb. 19, 2020, SanDisk Technologies LLC.
U.S. Appl. No. 16/794,563, filed Feb. 19, 2020, SanDisk Technologies LLC.
U.S. Appl. No. 16/849,600, filed Apr. 15, 2020, SanDisk Technologies LLC.
U.S. Appl. No. 16/849,664, filed Apr. 15, 2020, SanDisk Technologies LLC.
U.S. Appl. No. 17/001,003, filed Aug. 24, 2020, SanDisk Technologies LLC.
U.S. Appl. No. 17/090,420, filed Nov. 5, 2020, SanDisk Technologies LLC.
U.S. Appl. No. 17/169,987, filed Feb. 8, 2021, SanDisk Technologies LLC.
U.S. Appl. No. 17/122,360, filed Dec. 15, 2020, SanDisk Technologies LLC.
U.S. Appl. No. 17/189,153, filed Mar. 1, 2021, SanDisk Technologies LLC.
Yang, X., et al. "Dry etching of Al2O3 thin films in O2/BCl3/Ar inductively coupled plasma," Trans. Electr. Electron. Mater 11.5, pp. 202-205, (2010).

Boaz, E. et al., "4-bit per cell NROM reliability," IEEE International Electron Devices Meeting, 2005. IEDM Technical Digest. IEEE, (2005).
Boaz, E. et al., "NROM: A novel localized trapping, 2-bit nonvolatile memory cell," IEEE Electron Device Letters 21.11, pp. 543-545, (2000).
U.S. Appl. No. 16/142,447, filed Sep. 26, 2018, SanDisk Technologies LLC.
U.S. Appl. No. 16/423,500, filed May 28, 2019, SanDisk Technologies LLC.
U.S. Appl. No. 16/707,541, filed Dec. 9, 2019, SanDisk Technologies LLC.
U.S. Appl. No. 16/801,456, filed Feb. 26, 2020, SanDisk Technologies LLC.
U.S. Appl. No. 16/876,816, filed May 18, 2020, SanDisk Technologies LLC.
U.S. Appl. No. 16/876,877, filed May 18, 2020, SanDisk Technologies LLC.
U.S. Appl. No. 16/985,335, filed Aug. 5, 2020, SanDisk Technologies LLC.
U.S. Appl. No. 17/119,002, filed Dec. 11, 2020, SanDisk Technologies LLC.
U.S. Appl. No. 17/119,051, filed Dec. 11, 2020, SanDisk Technologies LLC.
Endoh, T. et al., "Novel Ultra High-Density Memory with a Stacked-Surrounding Gate Transistor (S-SGT) Structured Cell," IEDM Proc., (2001), 33-36.
International Search Report and Written Opinion of the International Searching Authority for International Application No. PCT/US2022/013782, mailed May 26, 2022, 11 pages.
U.S. Appl. No. 17/146,866, filed Jan. 12, 2021, SanDisk Technologies, LLC.
U.S. Appl. No. 17/174,064, filed Feb. 11, 2021, SanDisk Technologies, LLC.
U.S. Appl. No. 17/174,094, filed Feb. 11, 2021, SanDisk Technologies, LLC.
U.S. Appl. No. 17/244,258, filed Apr. 29, 2021, SanDisk Technologies, LLC.
U.S. Appl. No. 17/244,311, filed Apr. 29, 2021, SanDisk Technologies, LLC.
U.S. Appl. No. 17/328,302, filed May 24, 2021, SanDisk Technologies, LLC.
U.S. Appl. No. 17/355,883, filed Jun. 23, 2021, SanDisk Technologies, LLC.
U.S. Appl. No. 17/462,446, filed Aug. 31, 2021, SanDisk Technologies, LLC.
U.S. Appl. No. 17/510,833, filed Oct. 26, 2021, SanDisk Technologies, LLC.
U.S. Appl. No. 17/678,499, filed Feb. 23, 2022, SanDisk Technologies, LLC.
Eitan, B. et al., "4-bit per cell NROM reliability," IEEE International Electron Devices Meeting, 2005. IEDM Technical Digest. IEEE, (2005).
Eitan, B. et al., "NROM: A novel localized trapping, 2-bit nonvolatile memory cell," IEEE Electron Device Letters 21.11, pp. 543-545, (2000).
Krauss, T. et al., "Dual Metal-Gate Planar Field-Effect Transistor for Electrostatically Doped CMOS Design," *Technische Universität Darmstadt*, May 2014, arXiv, Project: Dehancement Mode Field Effect Transistor (DeFET) Devices.
Polishchuk, I. et al., "Dual Work Function Metal Gate CMOS Technology Using Metal Interdiffusion," *IEEE Electron Device Letters*, vol. 22, No. 9, pp. 444-446, Sep. 2001, doi: 10.1109/55.944334.

* cited by examiner

THREE-DIMENSIONAL MEMORY DEVICE INCLUDING VARIABLE THICKNESS SEMICONDUCTOR CHANNELS AND METHOD OF FORMING THE SAME

FIELD

The present disclosure relates generally to the field of semiconductor devices, and particularly to three-dimensional memory devices including locally thickened semiconductor channels for gate-induced drain leakage (GIDL) enhancement and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes an alternating stack of insulating layers and electrically conductive layers, where the electrically conductive layers include word line electrically conductive layers and a first select-level electrically conductive layer, a memory opening vertically extending through the alternating stack, and a memory opening fill structure located in the memory opening and including a memory film and a vertical semiconductor channel. A vertical cross-sectional profile of an outer sidewall of the vertical semiconductor channel is straight throughout the word line electrically conductive layers and contains a lateral protrusion at a level of the first select-level electrically conductive layer.

According to another aspect of the present disclosure, a method of forming a semiconductor structure is provided, which comprises: forming an alternating stack of insulating layers and sacrificial material layers over a substrate, wherein the sacrificial material layers comprise word-line-level sacrificial material layers comprising a first sacrificial material and at least one select-level sacrificial material layer comprising a second sacrificial material; forming a memory opening through the alternating stack; expanding the memory opening at each level of the at least one sacrificial material layer by performing an isotropic etch process that etches the second sacrificial material at a higher etch rate than the first sacrificial material; forming a memory opening fill structure in the memory opening, wherein the memory opening fill structure comprises a memory film and a vertical semiconductor channel; and replacing the sacrificial material layers with electrically conductive layers.

DETAILED DESCRIPTION

Figure 1A:
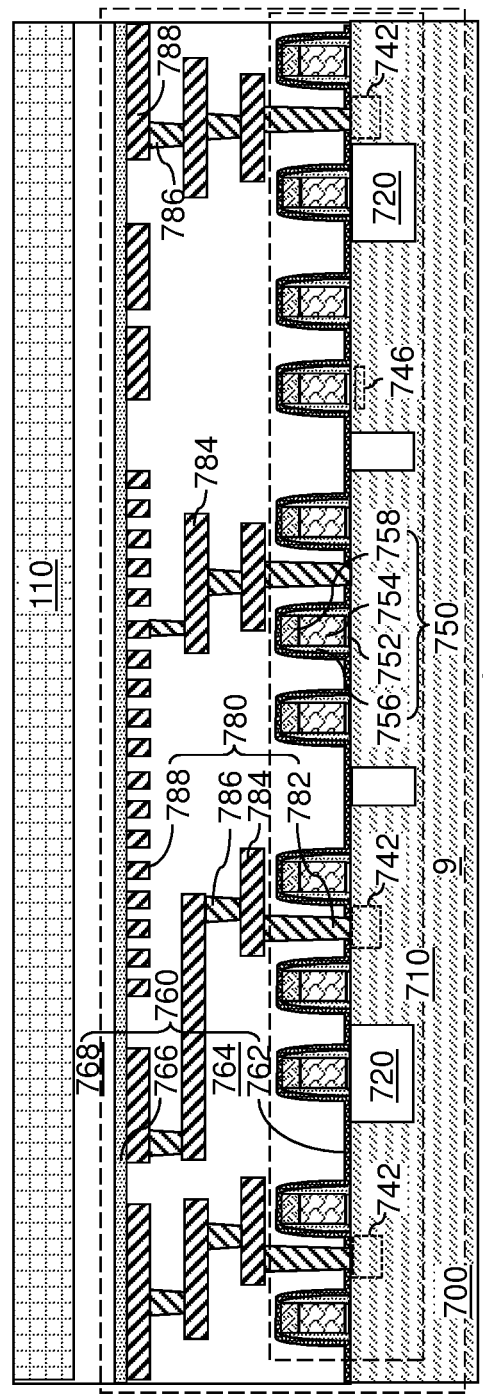
FIG. 1A is a vertical cross-sectional view of an exemplary structure after formation of semiconductor devices, lower level dielectric layers, and lower metal interconnect structures, on a semiconductor substrate according to an embodiment of the present disclosure.

As discussed above, embodiments of the present disclosure are directed to three-dimensional memory devices including locally thickened semiconductor channels adjacent to the select gate electrodes for gate-induced drain leakage (GIDL) enhancement and methods of manufacturing the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, a "prototype" structure or an "in-process" structure refers to a transient structure that is subsequently modified in the shape or composition of at least one component therein. As used herein, an electrical component is electrically connected to a second electrical component if there exists an electrically conductive path between the electrical component and the second electrical component.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded to each other, for example, by flip-chip bonding or another chip-to-chip bonding. A package or a chip may include a single semiconductor die (or a "die") or a plurality of semiconductor dies. A die is the smallest unit that can independently execute external commands or report status.

Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIGS. 1A, an exemplary structure according to an embodiment of the present disclosure is illustrated. The exemplary structure includes a substrate 9, such as a silicon wafer, and semiconductor devices 710 formed thereupon. Shallow trench isolation structures 720 may be formed in an upper portion of the substrate 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one second dielectric material layer 768 may comprise, or consist essentially of, dielectric material layers having dielectric constants that do not exceed the dielectric constant of undoped silicate glass (silicon oxide) of 3.9.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly.

Figure 1B:
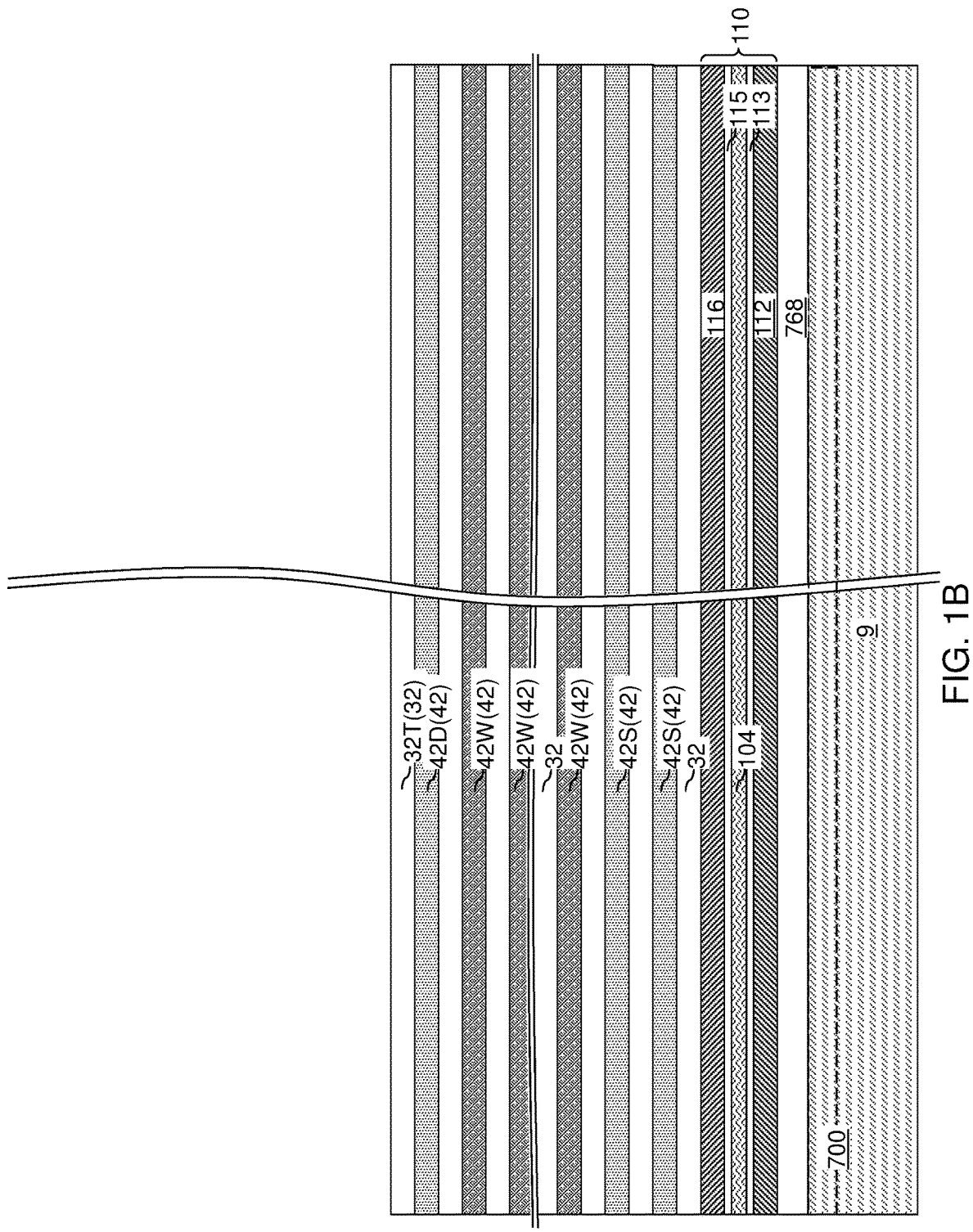
FIG. 1B is a vertical cross-sectional view of an exemplary structure after formation of in-process source level material layers.

Referring to FIG. 1B, the in-process source-level material layers 110' are formed over the lower-level dielectric material layers 760 and may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a source-level semiconductor layer 112 including a doped semiconductor material, a source-level dielectric layer 113, a source-level sacrificial layer 104 including a source-level sacrificial material, a second source-level dielectric layer 115, and the second source-level semiconductor layer 116 including a doped semiconductor material.

The doped semiconductor material of the second source-level semiconductor layer 116 may be the same as, or may be different from, the doped semiconductor material of the source-level semiconductor layer 112. For example, the doped semiconductor material may comprise heavily doped polysilicon. Each of the source-level semiconductor layer 112 and the second source-level semiconductor layer 116 may have a thickness in a range from 100 nm to 1,000 nm, although lesser and greater thicknesses may also be employed.

The source-level dielectric layer 113 and the second source-level dielectric layer 115 comprises a dielectric material, such as silicon oxide. Each of the source-level dielectric layer 113 and the second source-level dielectric layer 115 may have a thickness in a range from 5 nm to 200 nm, although lesser and greater thicknesses may also be employed.

The source-level sacrificial material of the source-level sacrificial layer 104 comprises a material that may be removed selective to the doped semiconductor materials of the source-level semiconductor layer 112 and the second source-level semiconductor layer 116. The source-level sacrificial material of the source-level sacrificial layer 104 may comprise silicon nitride, a silicon-germanium alloy, undoped amorphous silicon, undoped polysilicon, organosilicate glass, or any other material that may be subsequently removed selective to the materials of the source-level semiconductor layer 112 and the second source-level semiconductor layer 116. The thickness of the source-level sacrificial layer 104 may be in a range from 50 nm to 600 nm, such as from 100 nm to 300 nm, although lesser and greater thicknesses may also be employed.

A stack of an alternating plurality of insulating layers 32 and sacrificial material layer 42 is formed over the top surface of the in-process source-level material layers (112, 113, 104, 115, 116). As used herein, a "material layer" refers to a layer including a material throughout the entirety thereof. As used herein, an alternating plurality of elements and second elements refers to a structure in which instances of the elements and instances of the second elements alternate. Each instance of the elements that is not an end element of the alternating plurality is adjoined by two instances of the second elements on both sides, and each instance of the second elements that is not an end element of the alternating plurality is adjoined by two instances of the elements on both ends. The elements may have the same thickness thereamongst, or may have different thicknesses. The second elements may have the same thickness thereamongst, or may have different thicknesses. An alternating plurality of first material layers and second material layers may begin with an instance of the first material layers or with an instance of the second material layers, and may end with an instance of the first material layers or with an instance of the second material layers. In one embodiment, an instance of the elements and an instance of the second elements may form a unit that is repeated with periodicity within the alternating plurality.

The stack of the alternating plurality of insulating layers 32 and sacrificial material layer 42 is herein referred to as an alternating stack (32, 42). In one embodiment, each insulating layer 32 may consist essentially of an insulating material. Insulating materials that can be used for the insulating layers 32 include, but are not limited to, silicon oxide (including doped or undoped silicate glass), organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the insulating layers 32 can be silicon oxide.

The sacrificial material layers 42 comprise, from bottom to top, at least one source-select-level sacrificial material layer 42S, word-line-level sacrificial material layers 42W, and at least one drain-select-level sacrificial material layers 42D. The word-line-level sacrificial material layer 42W comprise a first sacrificial material, and the at least one source-select-level sacrificial material layer 42S and at least one drain-select-level sacrificial material layers 42D comprises a second sacrificial material having a higher etch rate than the first sacrificial material. The second sacrificial material may have a different composition and/or different density the first sacrificial material to provide the higher etch rate.

According to an aspect of the present disclosure, the first sacrificial material and the second sacrificial material are selected such that an isotropic etch process exists that can etch the second sacrificial material at a higher etch rate than the first sacrificial material and the insulating material of the insulating layers 32. In one embodiment, the first sacrificial material and the second sacrificial material are selected such that the isotropic etch process etches the first sacrificial material selective to the first sacrificial material and the insulating material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the isotropic etch process may provide an etch selectivity that is greater than 10, and/or greater than 100, between the second sacrificial material and the insulating material of the insulating layers 32. In one embodiment, the isotropic etch process may provide an etch selectivity that is greater than 2, and/or greater than 5, and/or greater than 10, between the second sacrificial material and the first sacrificial material.

In an illustrative example, the insulating layers 32 may comprise a silicon oxide material, such as undoped silicate glass or a doped silicate glass, the first sacrificial material of the word-line-level sacrificial material layer 42W may comprise a first silicon nitride material that is not doped with oxygen, and the second sacrificial material of the at least one source-select-level sacrificial material layer 42S and at least one drain-select-level sacrificial material layers 42D may comprise a second silicon nitride material that is doped with oxygen (e.g., silicon oxynitride). In one embodiment, the second silicon nitride material may have an etch rate that is at least twice, and/or at least 5 times, and/or at least 10 times, an etch rate of the first silicon nitride material in an etchant including hot phosphoric acid, or a mixture of dilute hydrofluoric acid and ethylene glycol, or a mixture of dilute hydrofluoric acid and propylene glycol.

The insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, by CVD or atomic layer deposition (ALD).

The topmost layer of the alternating stack (32, 42) may be an insulating layer 32, which is hereafter referred to as a topmost insulating layer 32T. The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Figure 2:
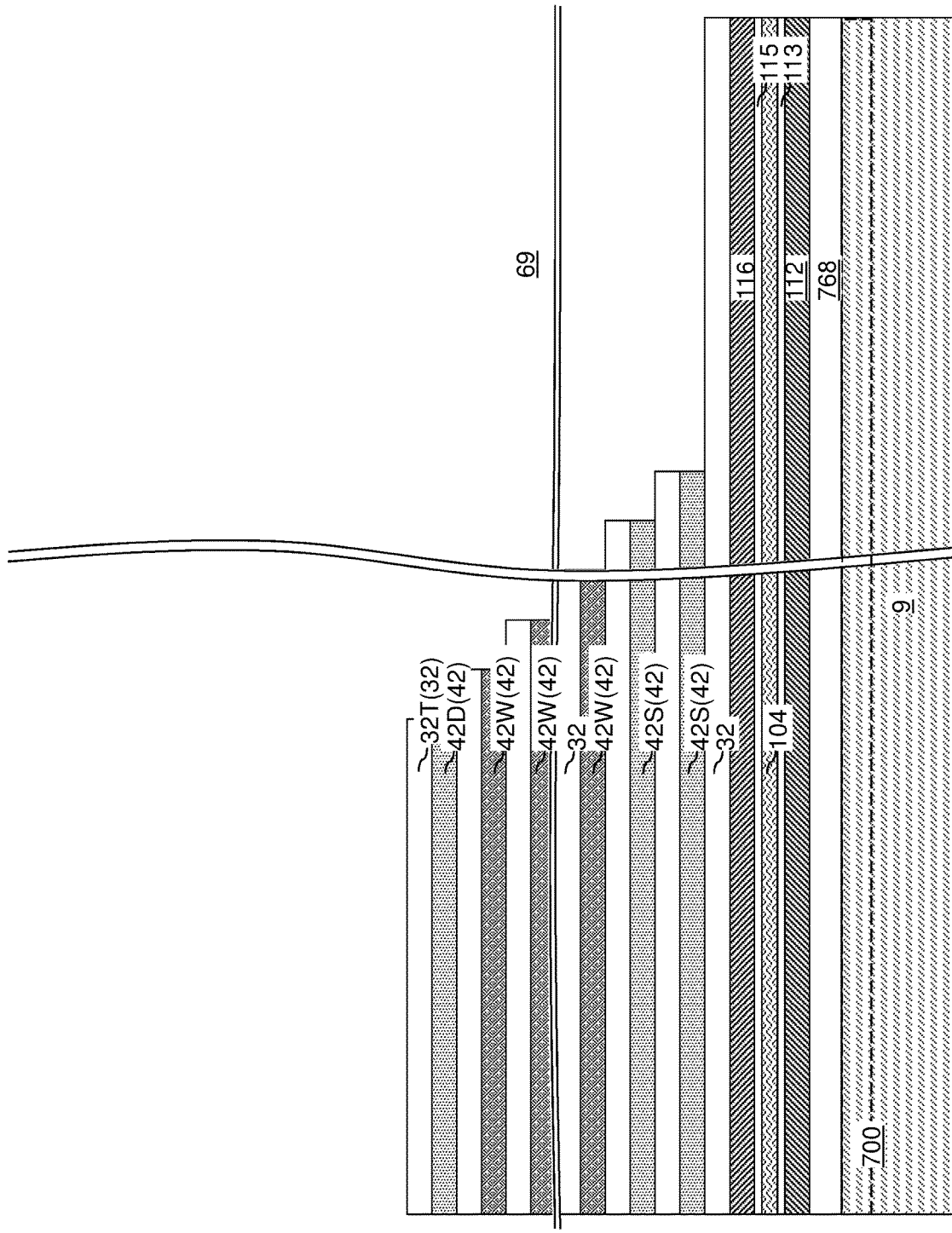
FIG. 2 is a schematic vertical cross-sectional view of the exemplary structure after formation of stepped surfaces according to an embodiment of the present disclosure.

Referring to FIG. 2, stepped surfaces are optionally formed by patterning the alternating stack (32, 42). The region including the stepped surfaces is herein referred to as a terrace region. As used herein, "stepped surfaces" refer to a set of surfaces that include at least two horizontal surfaces and at least two vertical surfaces such that each horizontal surface is adjoined to a first vertical surface that extends upward from an edge of the horizontal surface, and is adjoined to a second vertical surface that extends downward from a second edge of the horizontal surface. An optional stepped cavity 69 is formed within the volume from which portions of the alternating stack (32, 42) are removed through formation of the stepped surfaces. A "stepped cavity" refers to a cavity having stepped surfaces.

The stepped cavity 69 can have various stepped surfaces such that the horizontal cross-sectional shape of the stepped cavity changes in steps as a function of the vertical distance from the bottom surface of the buffer dielectric layer 111. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

In one embodiment, all layers of the alternating stack (32, 42) other than the bottommost insulating layer 32 may be patterned to provide stepped surfaces. In this case, each layer of the alternating stack (32, 42) other than the bottommost insulating layer 32 may have a respective physically exposed sidewall that is exposed to the stepped cavity 69. In one embodiment, each physically exposed sidewall of a sacrificial material layer 42 may be vertically coincident with a physically exposed sidewall of a respective overlying or underlying insulating material layer 32. Upon formation of the stepped surfaces, lateral extents of the sacrificial material layers 42 decrease with a vertical distance from the in-process a source-level material layers (112, 113, 104, 115, 116).

Figure 3:
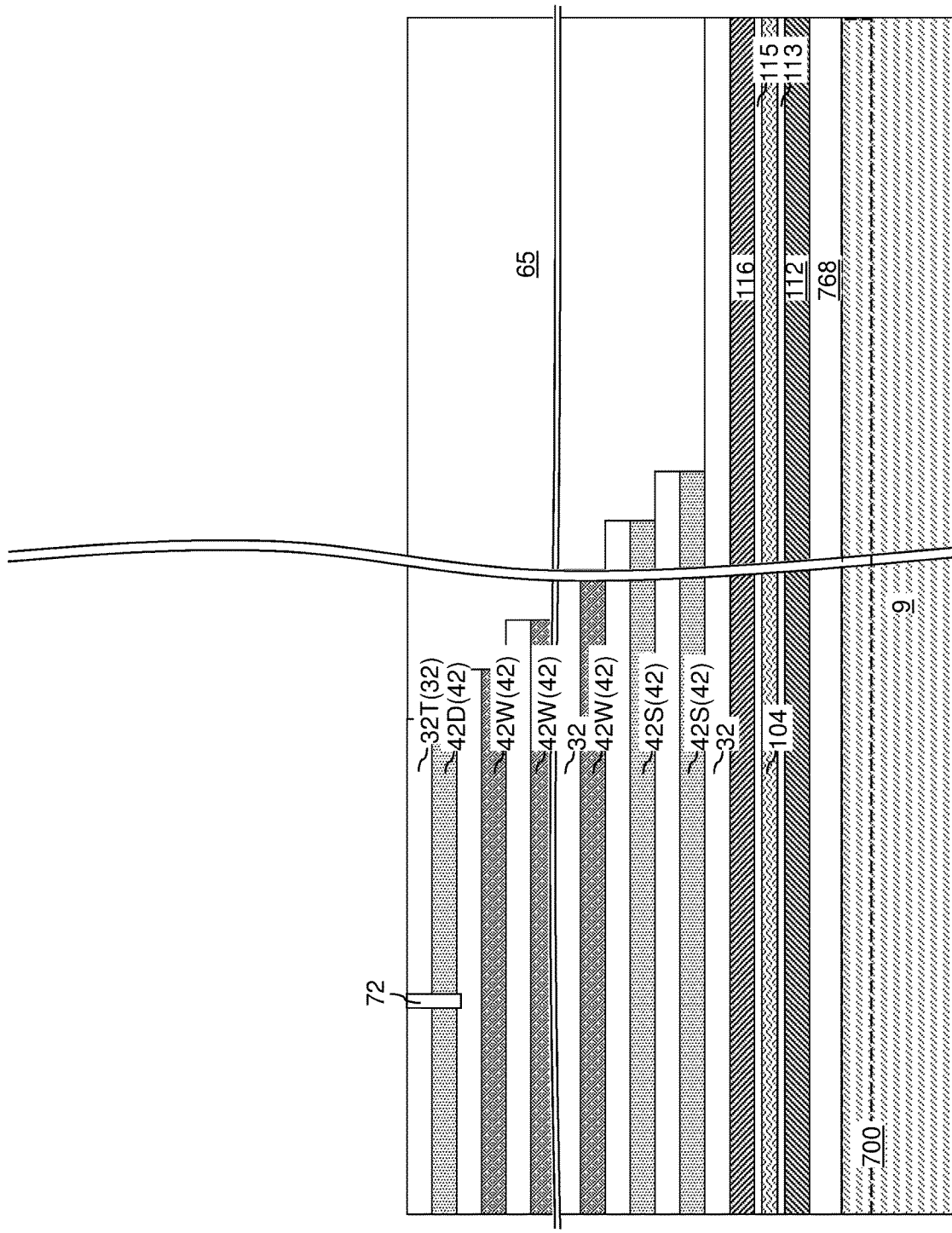
FIG. 3 is a schematic vertical cross-sectional view of the exemplary structure after formation of patterned plates, a stepped dielectric material portion, and drain-select-level isolation structures according to an embodiment of the present disclosure.

Referring to FIG. 3, if the stepped cavity 69 is formed, then a stepped dielectric material portion 65 (i.e., an insulating fill material portion) can be formed in the stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the substrate 9.

The stepped dielectric material portion 65 contacts sidewalls of the insulating layers 32 of the alternating stack (32, 42). In one embodiment, the stepped dielectric material portion 65 contacts stepped surfaces of the alternating stack (32, 42), and has a variable lateral extent that increases with a vertical distance from a horizontal plane including an interface between the alternating stack (32, 42) and the in-process source-level material layers (112, 113, 104, 115, 116).

Optionally, drain-select-level isolation structures 72 can be formed through the topmost insulating layer 32T and the at least one drain-select-level sacrificial material layer 42D located at the drain select level. The drain-select-level isolation structures 72 can be formed, for example, by forming drain-select-level isolation trenches and filling the drain-select-level isolation trenches with a dielectric material, such as silicon oxide. Excess portions of the dielectric material can be removed from above the top surface of the topmost insulating layer 32T.

Figure 4:
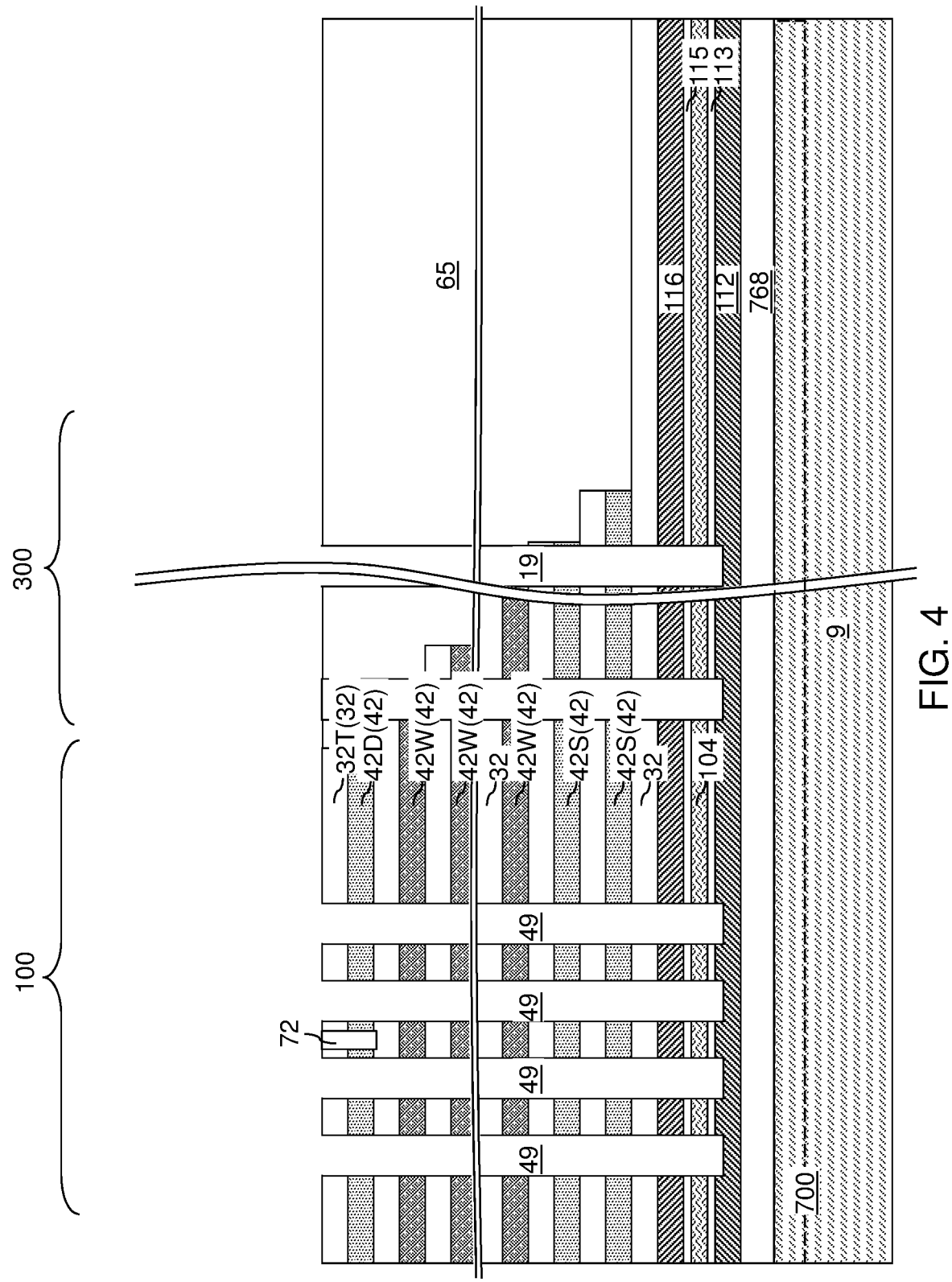
FIG. 4 is a schematic vertical cross-sectional view of the exemplary structure after formation of memory openings and support openings according to an embodiment of the present disclosure.

Referring to FIG. 4, a lithographic material stack (not shown) including at least a photoresist layer can be formed over the topmost insulating layer 32T and the stepped dielectric material portion 65, and can be lithographically patterned to form openings therein. The openings include a first set of openings formed over a memory array region 100 in which each layer of the alternating stack (32, 42) is present, and a second set of openings formed over a staircase region 300 including the stepped surfaces of the alternating stack (32, 42). The pattern in the lithographic material stack can be transferred through the topmost insulating layer 32T or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to on upper portion of the source-level semiconductor layer 112. A surface of the first to source-level semiconductor layer 112 may be physically exposed at the bottom of each memory opening 49 and at the bottom of each support opening 19.

FIGS. 5A-5I are sequential vertical cross-sectional views of a memory opening 49 during formation of a memory opening fill structure 58 according to an embodiment of the present disclosure.

Figure 5B:
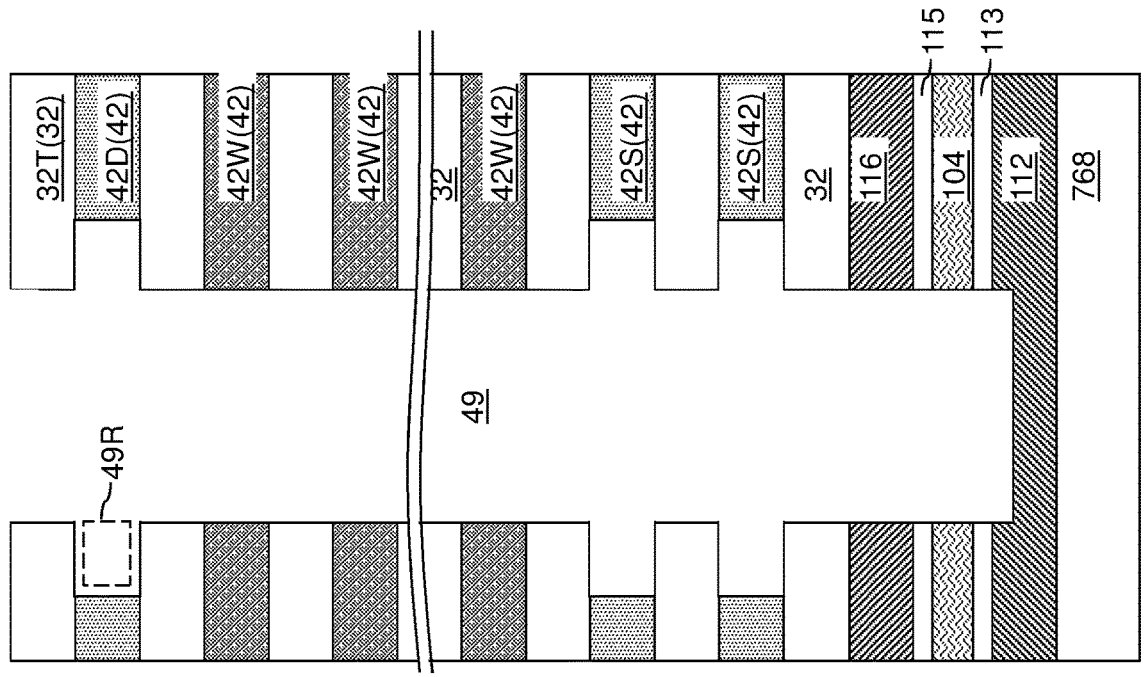
FIGS. 5A-5I are sequential vertical cross-sectional views of a memory opening during formation of a memory opening fill structure according to an embodiment of the present disclosure.
Figure 5A:
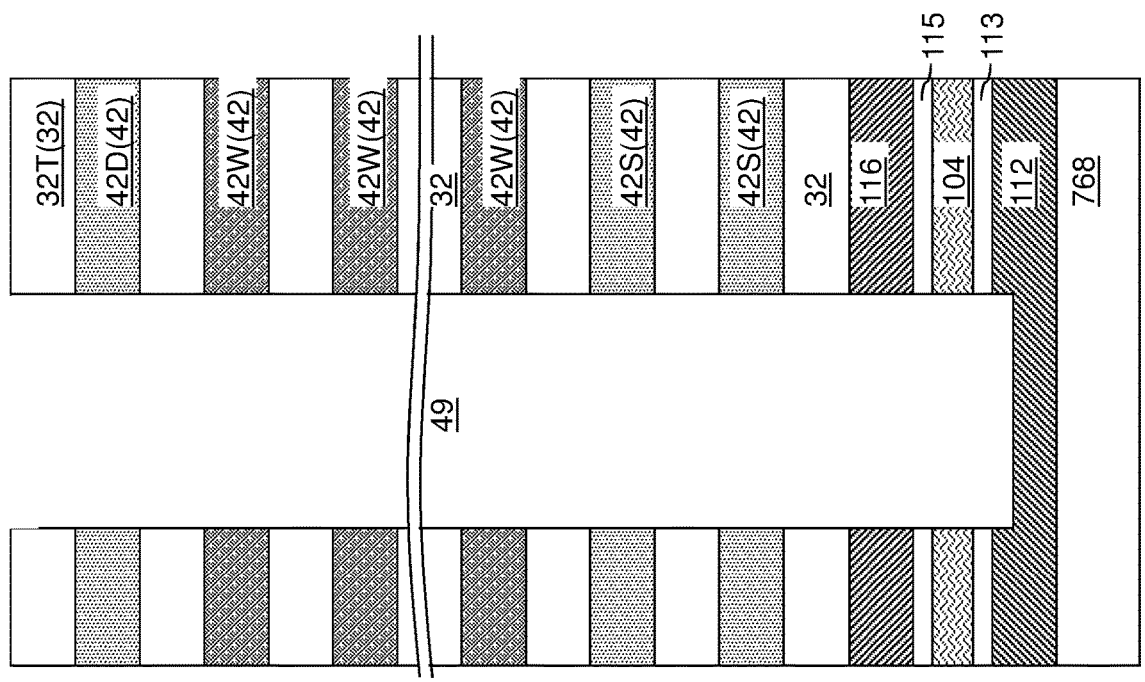

Referring to FIG. 5A, a memory opening 49 is illustrated, which vertically extends from a topmost insulating layer 32T to the source-level semiconductor layer 112.

Referring to FIG. 5B, a selective isotropic etch process can be performed to expanding each memory opening 49 at each level of the select-level sacrificial material layers (42S, 42D). The selective isotropic etch process can be an isotropic etch process that etches the second sacrificial material of the select-level sacrificial material layers (42S, 42D) at a higher etch rate than the first sacrificial material of the word-line-level sacrificial material layers 42W. The selective isotropic etch process may also etch the second sacrificial material selective to the material of the insulating layers 32. In one embodiment, the ratio of the etch rate of the second sacrificial material to the first sacrificial material may be greater than 2, and/or may be greater than 5, and/or may be greater than 10. In one embodiment, the etch rate of the second sacrificial material to the material of the insulating layers 32 may be greater than 10, and/or greater than 100.

In one embodiment, the insulating layers 32 may comprise and/or may consist essentially of silicon oxide, the first sacrificial material of the word-line-level sacrificial material layers 42W may comprise a first silicon nitride material (e.g., undoped silicon nitride) having a relatively low etch rate, and the second sacrificial material of the select-level sacrificial material layers (42S, 42D) may comprise a second silicon nitride material (e.g., oxygen doped silicon nitride) having a relatively high etch rate. In this case, the selective isotropic etch process may comprise a wet etch process employing hot phosphoric acid, or a mixture of dilute hydrofluoric acid and ethylene glycol or a mixture of dilute hydrofluoric acid and propylene glycol.

Each memory opening is laterally expanded at each level of the select-level sacrificial material layers (42S, 42D). Each portion of the memory opening 49 that is located at a level of a select-level sacrificial material layer (42S, 42D) is expanded by the isotropic etch process to form an annular recess cavity 49R. Each annular recess cavity 49R can be vertically bounded by a respective overlying insulating layer 32 and a respective underlying insulating layer 32, and can be laterally bounded by a recessed sidewall of a respective a select-level sacrificial material layer (42S, 42D). The duration of the selective isotropic etch process can be performed that the recessed sidewalls of the select-level sacrificial material layer (42S, 42D) are vertically offset outward from a cylindrical vertical plane including sidewalls of a respective overlaying insulating layer 32 and a respective underlying insulating layer 32 by a lateral offset distance. The lateral offset distance may be in a range from 20 nm to 200 nm, such as from 30 nm to 100 nm, although lesser and greater lateral offset distances may also be employed.

While an embodiment in which the alternating stack comprises two source-select-level sacrificial material layers 42S and one drain-select-level sacrificial material layers 42D is illustrated in FIGS. 5A and 5B, the total number of the source-select-level sacrificial material layers 42S may be any integer in a range from 1 to 8, and the total number of the drain-select-level sacrificial material layers 42D may be any integer in a range from 1 to 8. Thus, while only one drain-select-level sacrificial material layer 42D is illustrated, in other embodiments, there may be two or more, such as two to eight drain-select-level sacrificial material layers 42D overlying word-line-level sacrificial material layers 42W. In this case, the uppermost drain-select-level sacrificial material layer 42D comprises the second sacrificial material (e.g., oxygen doped silicon nitride), while the additional drain-select-level sacrificial material layers 42D may comprise either the second sacrificial material and/or the first sacrificial material (e.g., undoped silicon nitride). Other alternative embodiments in which the total number of the source-select-level sacrificial material layers 42S and/or the total number of the drain-select-level sacrificial material layers 42D differs from the numbers represented in the drawings are expressly contemplated herein.

Figure 5D:
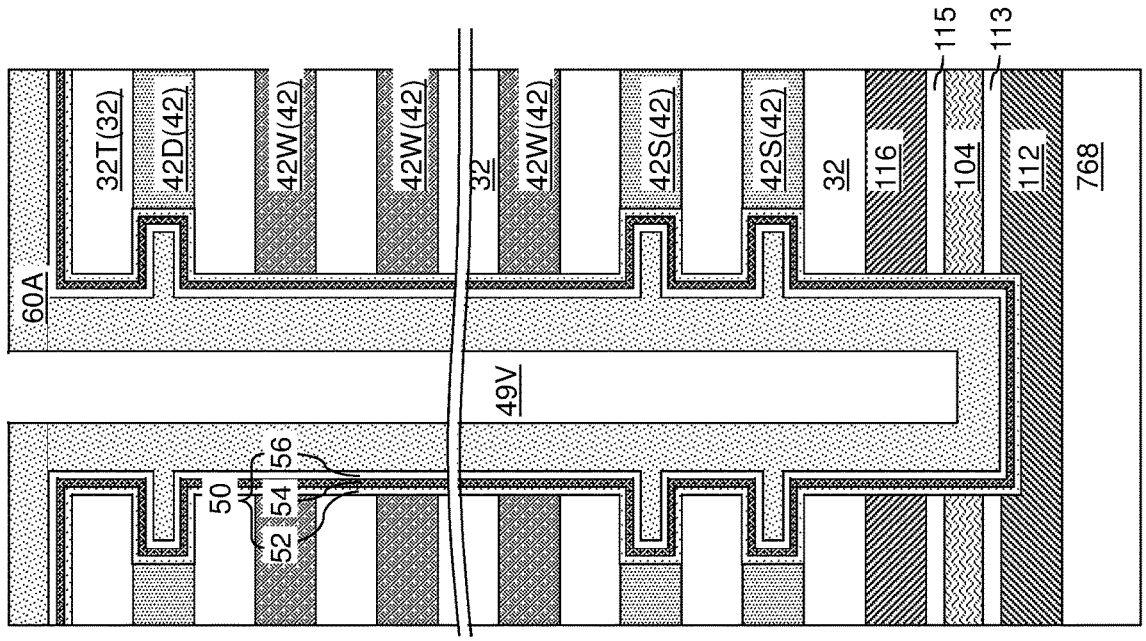
Figure 5C:
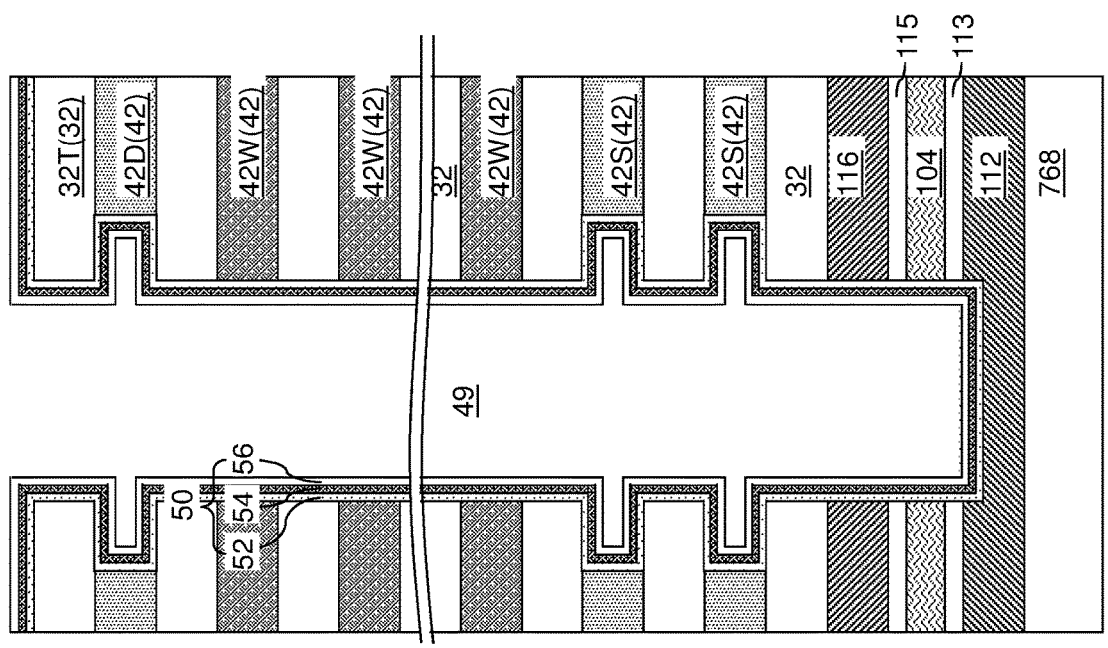

Referring to FIG. 5C, a memory film 50 comprising a stack of layers including a blocking dielectric layer 52, a memory material layer 54, and a dielectric material liner 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 is an optional material layer that may or may not be employed. In case the memory material layer 54 comprises a charge storage layer, the dielectric material liner 56 may comprise a tunneling dielectric layer including a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may include a stack of a silicon oxide layer, a silicon oxynitride layer, and a second silicon oxide layer, which is commonly known as an ONO stack. In one embodiment, the dielectric material liner 56 may include a silicon oxide layer that is substantially free of carbon or a silicon oxynitride layer that is substantially free of carbon. The thickness of the dielectric material liner 56 may be in a range from 2 nm to 20 nm, although lesser and greater thicknesses may also be used.

Generally, the memory film 50 is deposited in each annular recess cavity 49R and on sidewalls of the insulating layers 32 around the memory opening 49. In one embodiment, the memory film 50 has a thickness that is less than one half of a height of each annular recess cavity 49R. Thus, an unfilled annular void is present at each level of the annular recess cavities 49R after formation of the memory film 50.

Referring to FIG. 5D, an amorphous channel material layer 60A can be deposited over the memory film 50. The amorphous channel material layer 60A comprises at least one elemental semiconductor material, at least one III-V compound semiconductor material, at least one II-VI compound semiconductor material, or other semiconductor materials known in the art. The amorphous channel material layer 60A may comprise amorphous silicon. In one embodiment, the amorphous channel material layer 60A completely fills the recesses 49R.

The amorphous channel material layer 60A may comprise a low doped or undoped amorphous semiconductor material, i.e., intrinsic amorphous silicon or low doped amorphous silicon doped with dopant of a first conductivity type (e.g., p-type). Thus, the amorphous channel material layer 60A may include dopants (e.g., boron in amorphous silicon) at a total atomic concentration that is not greater than $1.0 \times 10^{15}/cm^3$, and/or is not greater than $1.0 \times 10^{14}/cm^3$, and/or is not greater than $1.0 \times 10^{13}/cm^3$. The thickness of the amorphous channel material layer 60A is selected such that a vertically-extending unfilled void 49V remains in each memory opening 49. For example, the thickness of the amorphous channel material layer 60A may be in a range from 20 nm to 100 nm, although lesser and greater thicknesses may also be employed.

Figure 5E:
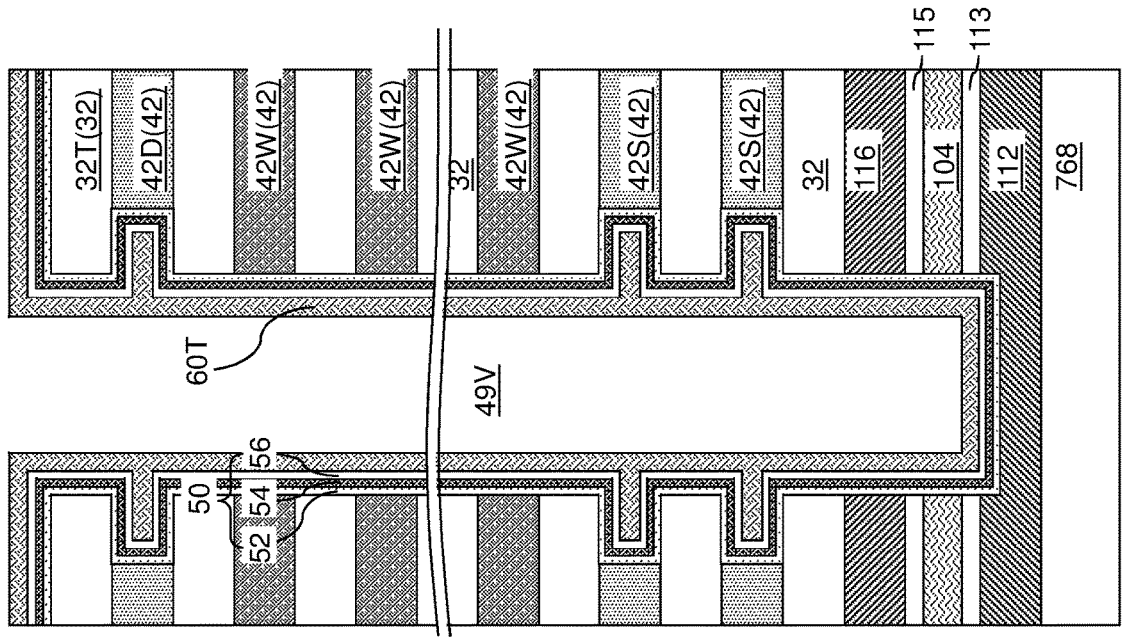

Referring to FIG. 5E, an anneal process can be performed to convert the amorphous channel material layer 60A into a polycrystalline channel material layer 60P (e.g., polysilicon layer). The elevated temperature of the anneal process may be in a range from 650 degrees Celsius to 1,100 degrees Celsius. The duration of the anneal process may be in a range from 1 second to 2 hours. Generally, the higher the elevated temperature of the anneal process, the shorter the duration of the anneal process.

Figure 5F:
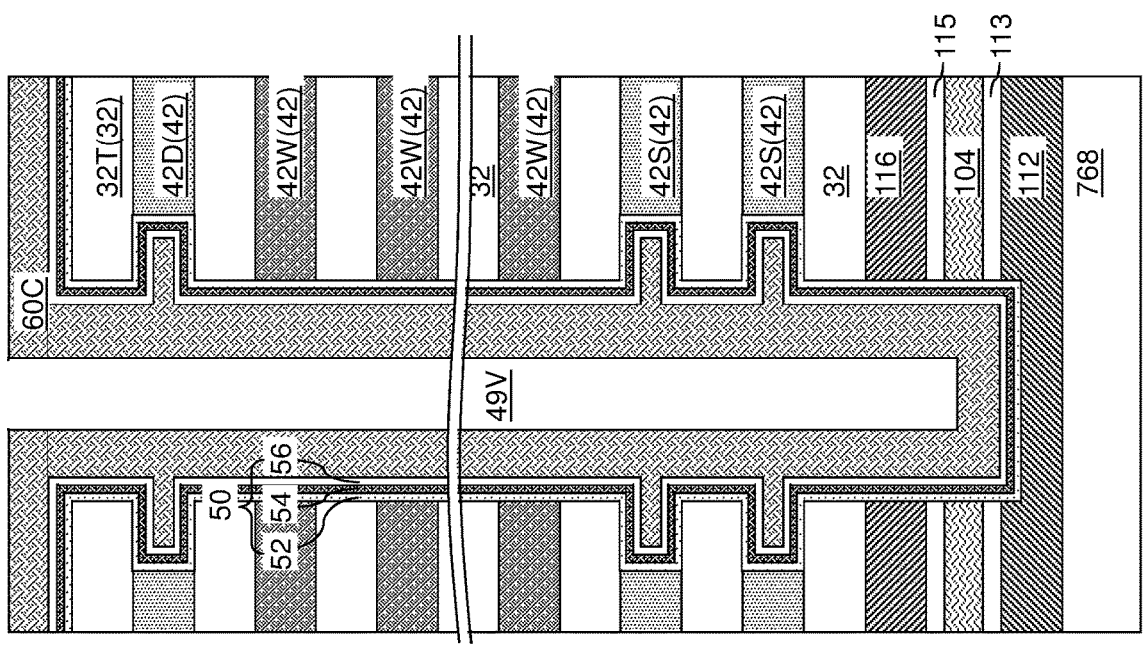

Referring to FIG. 5F, the polycrystalline channel material layer 60P may be isotropically etched back such that a remaining portion of the polycrystalline channel material layer 60P has a thickness in a range from 3 nm to 60 nm, such as from 6 nm to 20 nm. The thinned remaining portion of the polycrystalline channel material layer 60P is herein referred to as a thinned semiconductor channel material layer 60T. The thinned semiconductor channel material layer 60T includes polycrystalline semiconductor material (e.g., intrinsic or low doped polysilicon of the first conductivity type).

Figure 5H:
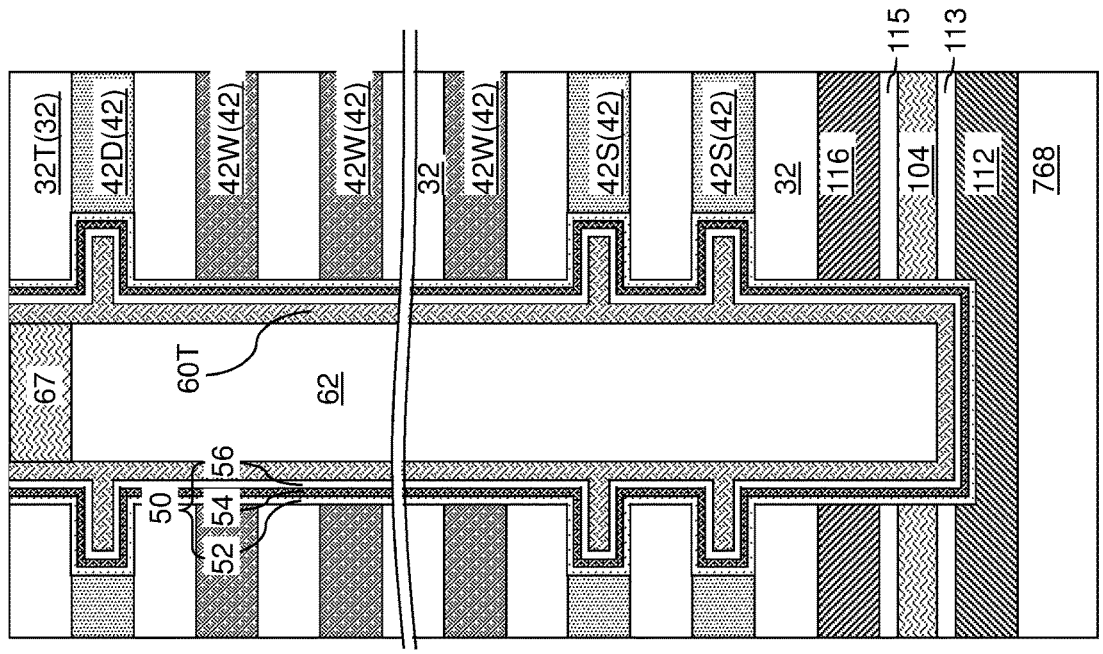
Figure 5G:
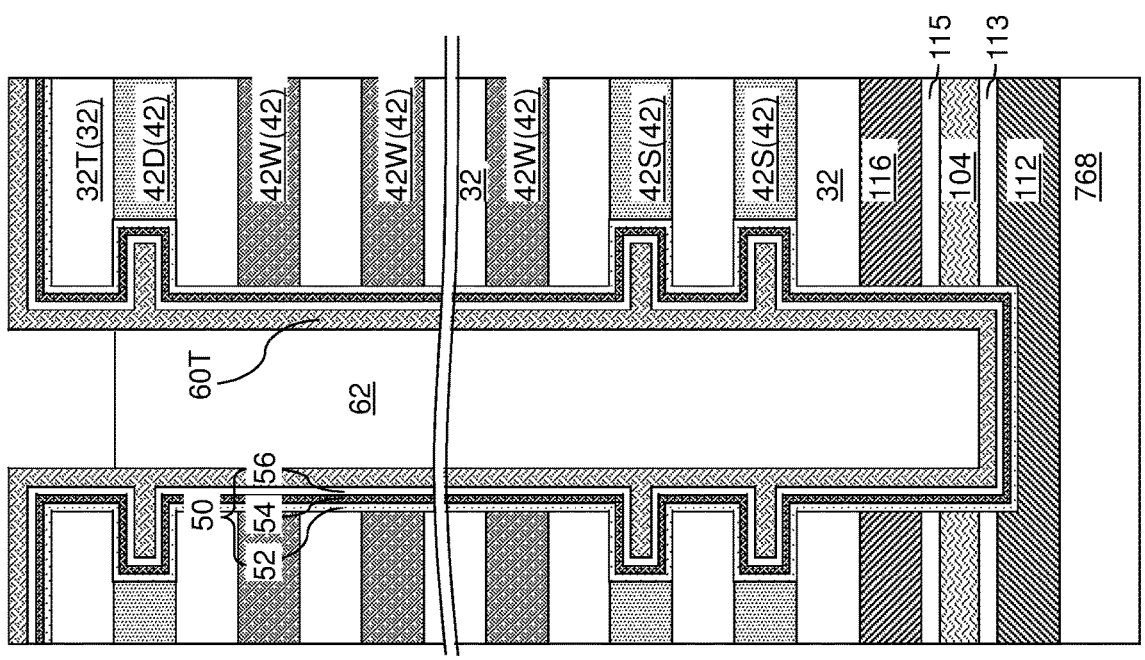

Referring to FIG. 5G, a dielectric core layer may be deposited in unfilled volumes (e.g., in the voids 49V) of the memory openings 49 and/or the support openings 19. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the topmost surface of the alternating stack (32, 42) may be removed, for example, by a recess etch. The recess etch continues until top surfaces of the remaining portions of the dielectric core layer are recessed to a height between the top surface of the topmost insulating layer 32T and the bottom surface of the topmost insulating layer 32. Each remaining portion of the dielectric core layer constitutes a dielectric core 62.

Referring to FIG. 5H, an amorphous drain semiconductor material may be deposited in cavities overlying the dielectric cores 62. Portions of the amorphous drain semiconductor material, the thinned semiconductor channel material layer 60T, and the memory film 50 that overlie the horizontal plane including the top surface of the topmost insulating layer 32T may be removed by a planarization process such as a chemical mechanical planarization (CMP) process. Each remaining portion of the amorphous drain semiconductor material constitutes an amorphous drain semiconductor material portion 67. In one embodiment, the amorphous drain semiconductor material portion 67 may comprise doped amorphous silicon containing dopants of the second conductivity type (e.g., phosphorus and/or arsenic) at an atomic concentration in a range from $1.0 \times 10^{18}/cm^3$ to $1.0 \times 10^{21}/cm^3$, although lesser and greater dopant concentrations may also be used.

Figure 5I:
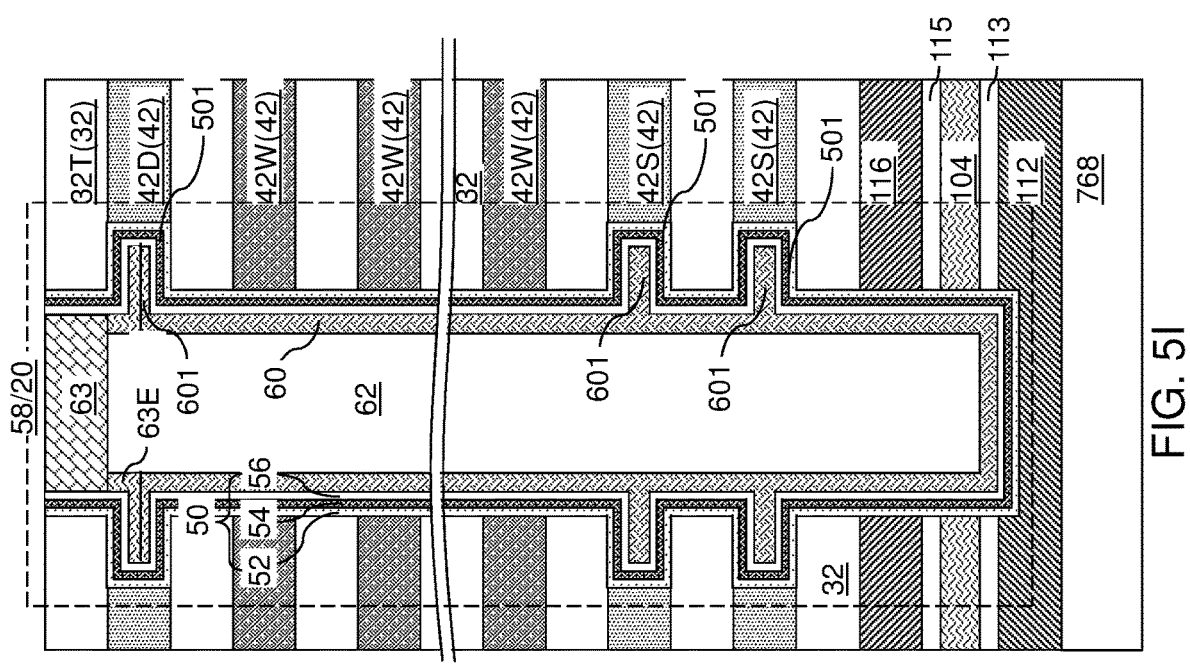

Referring to FIG. 5I, a post deposition anneal process (e.g., a rapid thermal anneal or a furnace anneal) may be performed to outdiffuse dopants of the second conductivity type into a top region of the thinned semiconductor channel material layer 60T. In this case, the amorphous drain semiconductor material portion 67 can be converted into a polycrystalline (e.g., polysilicon) drain region 63 and the outdiffused dopants form a drain extension region 63E in the top region of the thinned semiconductor channel material layer 60T. The atomic concentration of dopants of the second conductivity type in the drain extension region 60E may be in a range from $1.0 \times 10^{16}/cm^3$ to $1.0 \times 10^{18}/cm^3$, although lesser and greater dopant concentrations may also be used.

The remaining portion of the thinned semiconductor channel material layer 60T comprises a vertical semiconductor channel 60. In some embodiments, the boundary between the vertical semiconductor channel 60 of the first conductivity type and the drain extension region 63E of the second conductivity type may be formed at or below a portion of the semiconductor material that fills a volume of an annular recess cavity 49R at the level of the drain-select-level sacrificial material layer 42D. A p-n junction can be formed between the drain extension region 63E and the vertical semiconductor channel 60.

The combination of all material portions located in a memory opening 49 constitutes a memory opening fill structure 58. Each support opening 19 can be filled with a respective set of material portions having the same material composition as a corresponding component in a memory opening fill structure 58. Each set of material portions filling a support opening 19 is herein referred to as a support pillar structure 20. Each of the memory opening fill structures 58 comprises a respective vertical semiconductor channel 60 and a respective vertical stack of memory elements, which may be embodied, for example, as portions of a respective memory material layer 54 that are located at levels of the sacrificial material layers 42. Each memory opening fill structure 58 is formed on a sidewall of the source-level sacrificial layer 104.

According to an aspect of the present disclosure, the vertical semiconductor channel 60 comprises at least one laterally-protruding portion that is formed within a respective annular recess cavity 49R. In one embodiment, a vertical cross-sectional profile of an outer sidewall of the memory film 50 is straight throughout the word line sacrificial material layers 42W, and comprises a first lateral protrusion 501 at a level of a first select-level sacrificial material layer (42S, 42D) within the at least one select-level sacrificial material layer (42S, 42D). The first select-level sacrificial material layer (42S, 42D) may be any of the at least one source-select-level sacrificial material layer 42S and/or the at least one drain-select-level sacrificial material layer 42D. In one embodiment, the memory film 50 has a uniform thickness in vertically-extending segments within the first lateral protrusion 501, in horizontally-extending segments within the first lateral protrusion 501, and in portions that extend straight throughout the word line sacrificial material layers 42W. In other words, the memory film 50 is continuous and has a uniform thickness throughout.

In one embodiment, a vertical cross-sectional profile of an outer sidewall of the vertical semiconductor channel 60 comprises a second lateral protrusion 601 at the level of the first select-level sacrificial material layer (42S, 42D), which may be any of the at least one source-select-level sacrificial material layer 42S and the at least one drain-select-level sacrificial material layer 42D. In one embodiment, the vertical cross-sectional profile of an inner sidewall of the vertical semiconductor channel 60 is straight throughout the word line sacrificial material layers 42W and throughout each of the at least one select-level sacrificial material layer (42S, 42D). In one embodiment, a vertical extent of the first lateral protrusion 501 is the same as a vertical spacing between an overlying insulating layer 32 among the insulating layers 32 that contacts an annular top surface of the first lateral protrusion and an underlying insulating layer 32 of the insulating layers 32 that contacts an annular bottom surface of the first lateral protrusion 501. In one embodiment, the memory film 50 has a uniform thickness in vertically-extending segments within the first lateral protrusion 501, in horizontally-extending segments within the first lateral protrusion 501, and in portions that extend straight throughout the word line sacrificial material layers 42W. In one embodiment, a vertical extent of the second lateral protrusion 601 (e.g., the source-select levels) is the same as the vertical extent of the first lateral protrusion 501 less twice the uniform thickness of the memory film 50.

In one embodiment, the memory opening fill structure 58 comprises a drain region 63 located at an upper end of the vertical semiconductor channel 60 of the first conductivity type and including dopants of a second conductivity type that is an opposite of the first conductivity type. In one embodiment, a drain extension region 63E is adjoined to the drain region 63 and forms a p-n junction at an interface with the vertical semiconductor channel 60.

In one embodiment, the vertical semiconductor channel 60 has a uniform lateral thickness between a straight inner sidewall segment and a straight outer sidewall segment throughout the word line sacrificial material layers 42W. In one embodiment, the second lateral protrusion portion 601 has a lateral thickness between an outer sidewall and an inner sidewall that is greater than the uniform lateral thickness of the vertical semiconductor channel. The lateral thickness of the second lateral protrusion portion 601 may be about the same as the lateral recess distance of an annular recess cavity 49R. In one embodiment, the second lateral protrusion portion 601 includes an end region of the vertical semiconductor channel, while an entirety of an inner sidewall of the vertical semiconductor channel 60 can be straight. In one embodiment, an outer sidewall of the vertical semiconductor channel 60 is straight at each level of the word line sacrificial material layers 42W and comprises the first lateral protrusion 501 at the level of the first select-level sacrificial material layer (42S and/or 42D).

Figure 6:
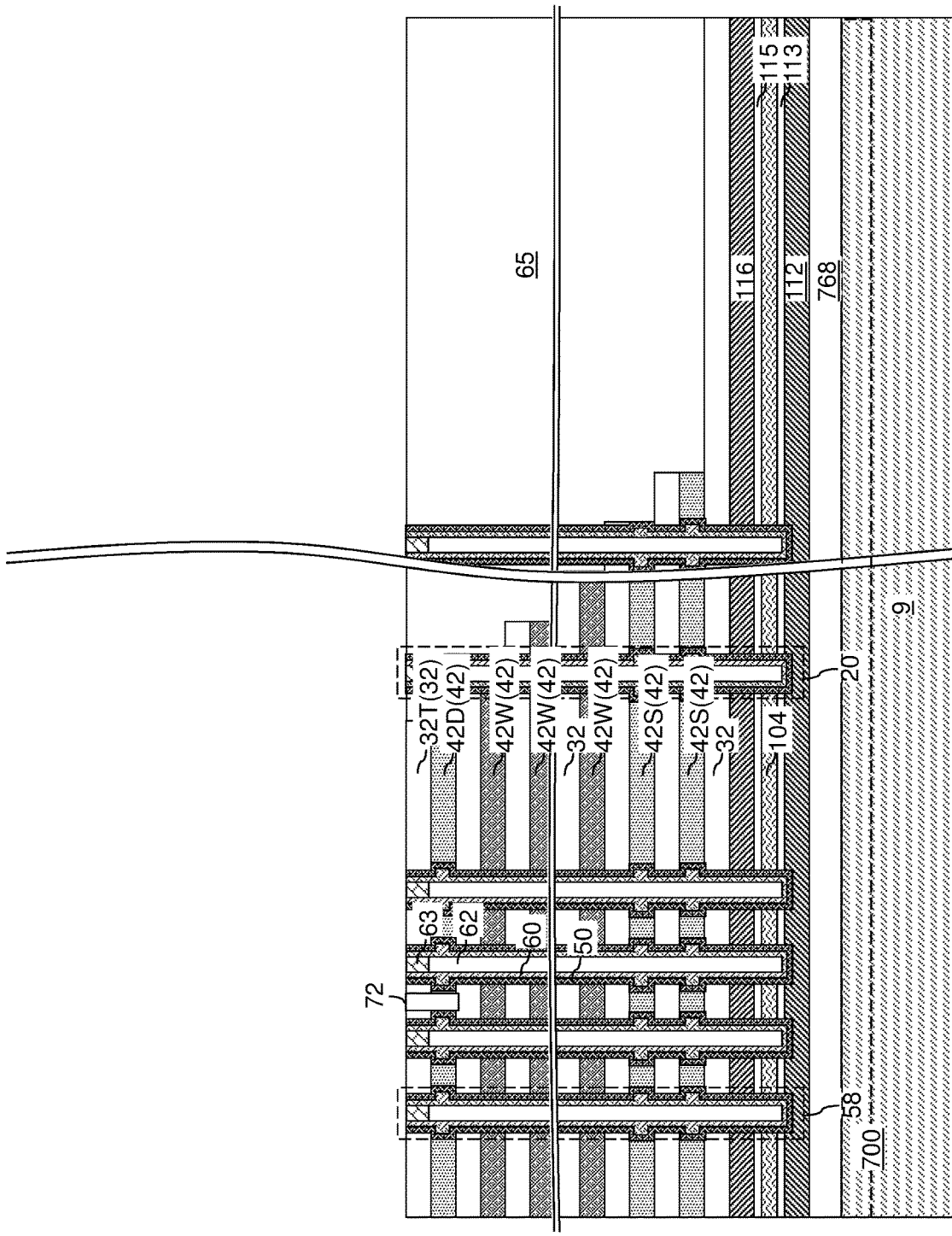
FIG. 6 is a schematic vertical cross-sectional view of the exemplary structure after formation of memory opening fill structures and support pillar structures according to an embodiment of the present disclosure.

Referring to FIG. 6, the exemplary structure is illustrated after formation of the memory opening fill structures 58 and the support pillar structures 20. Each memory opening 49 is filled with a memory opening fill structure 58. Each support opening 19 is filled with a support pillar structure 20.

Figure 7A:
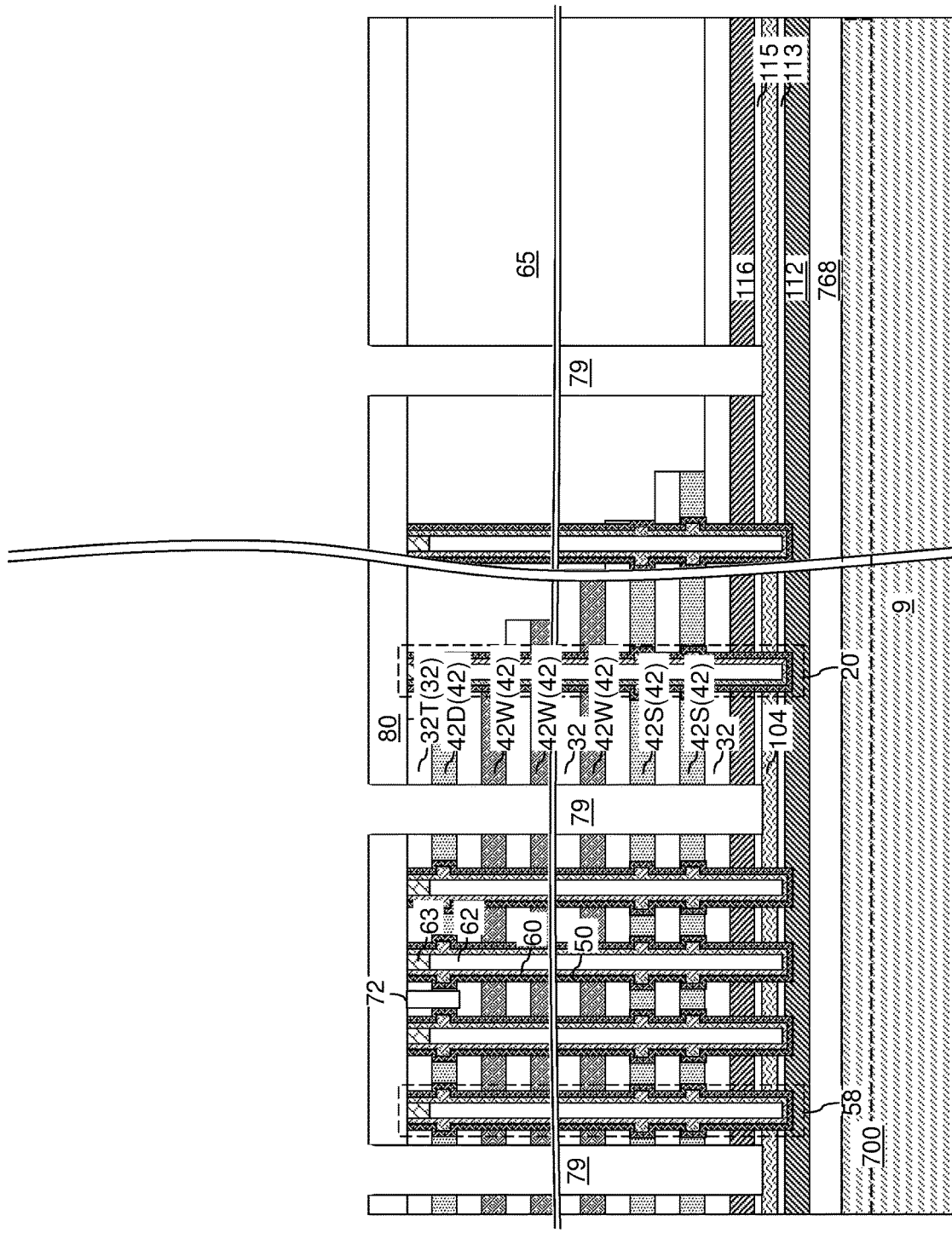
FIG. 7A is a schematic vertical cross-sectional view of the exemplary structure after formation of a contact-level dielectric layer and through-stack trenches according to an embodiment of the present disclosure.
Figure 7B:
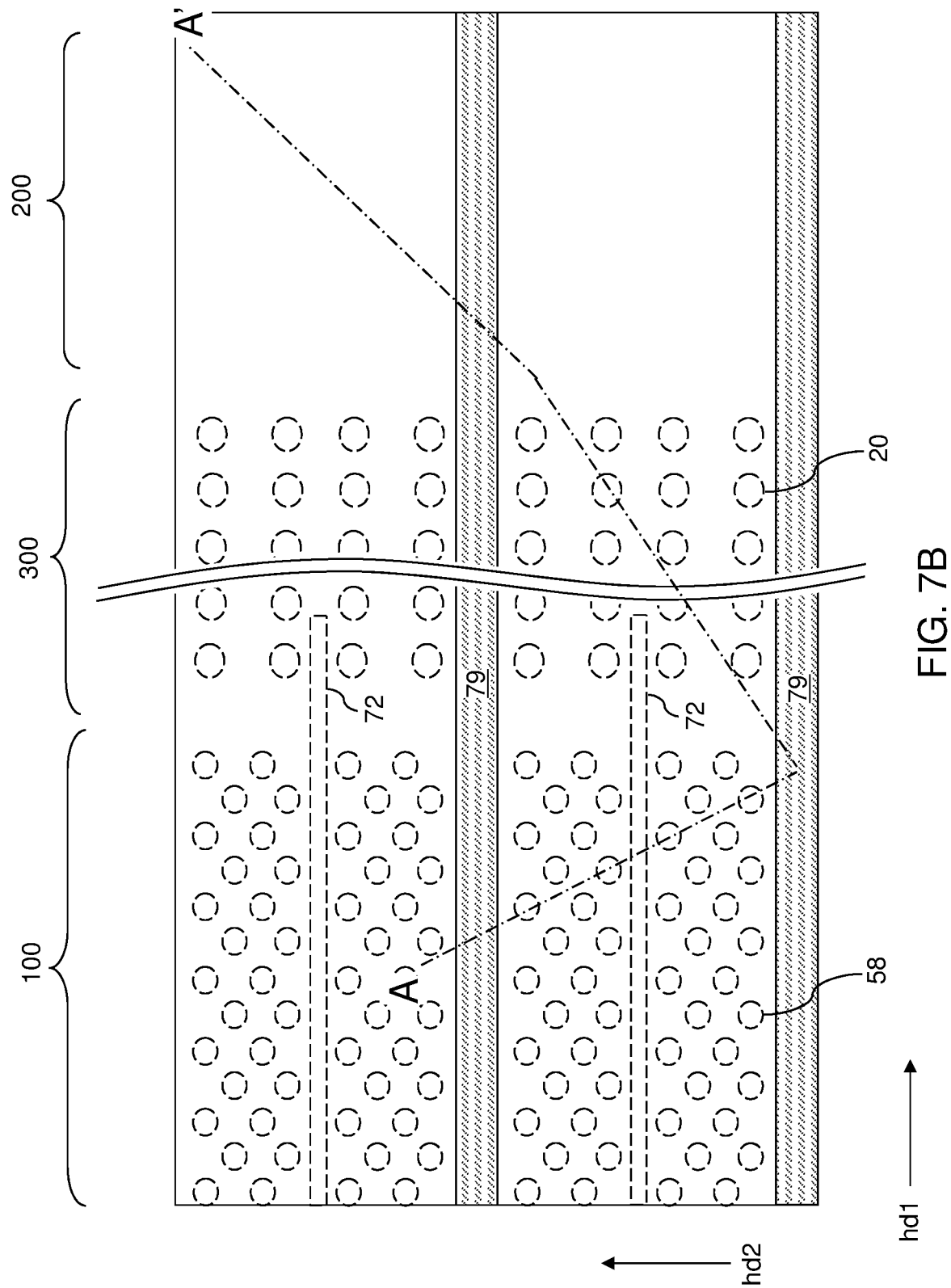
FIG. 7B is a partial see-through top-down view of the exemplary structure of FIG. 7A. The hinged vertical plane A-A' is the plane of the schematic vertical cross-sectional view of FIG. 7A.

Referring to FIGS. 7A and 7B, a contact-level dielectric layer 80 can be formed over the alternating stack (32, 42) of insulating layer 32 and sacrificial material layers 42, and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be used.

A photoresist layer (not shown) can be applied over the contact-level dielectric layer 80, and is lithographically patterned to form openings in areas between clusters of memory opening fill structures 58. The pattern in the photoresist layer can be transferred through the contact-level dielectric layer 80, the alternating stack (32, 42) and/or the stepped dielectric material portion 65 using an anisotropic etch to form through-stack trenches 79, which vertically extend from the top surface of the contact-level dielectric layer 80 at least to the top surface of the source-level sacrificial layer 104.

In one embodiment, the memory opening fill structures 58 may be formed in a memory array region 100, the support pillar structures 20 and the stepped surfaces of the alternating stack (32, 42) may be formed in a staircase region 300. A connection via region 200 may be provided in which the sacrificial material layers 42 are not present. The through-stack trenches 79 may continuously extend through each of the memory array region 100, the staircase region 300, and the connection via region 200.

In one embodiment, the through-stack trenches 79 can laterally extend along a first horizontal direction hd1 and can be laterally spaced apart one from another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each through-stack trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a through-stack trench 79 and a drain-select-level isolation structure 72, or between a neighboring pair of drain-select-level isolation structures 72. In one embodiment, the through-stack trenches 79 can include a source contact opening in which a source contact via structure can be subsequently formed. The photoresist layer can be removed, for example, by ashing.

Figure 8:
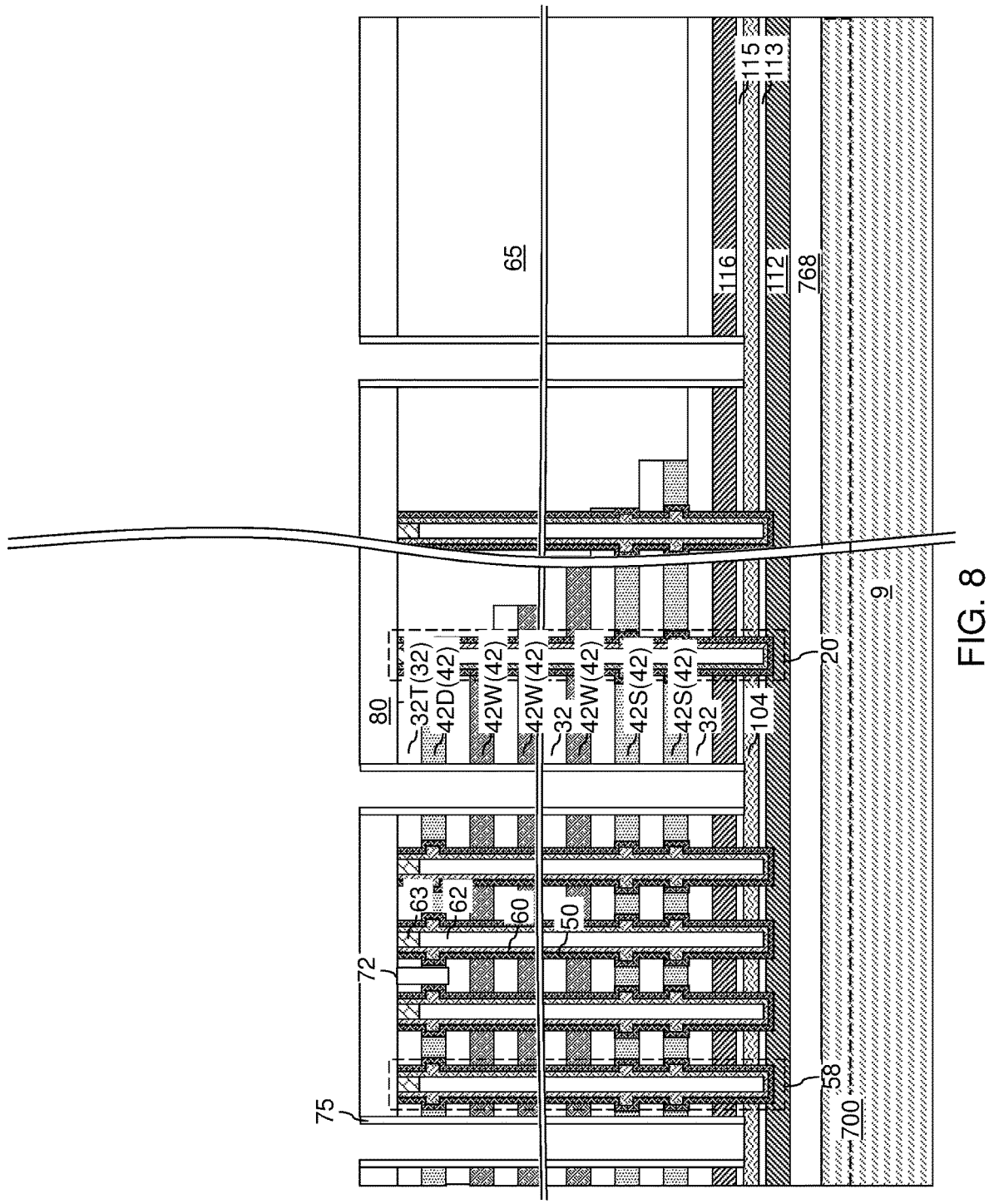
FIG. 8 is a schematic vertical cross-sectional view of the exemplary structure after formation of sacrificial etch stop spacers according to an embodiment of the present disclosure.

Referring to FIG. 8, a sacrificial etch stop material may be conformally deposited in the through-stack trenches 79 and over the contact-level dielectric layer 80, and can be anisotropically etched to form sacrificial etch stop spacers 75 at a peripheral portion of each of the through-stack trenches 79. The sacrificial etch stop material is different from the material of the source-level sacrificial layer 104. In an illustrative example, if the source-level sacrificial layer 104 comprises silicon nitride, the sacrificial etch stop material may comprise silicon oxide. The thickness of the sacrificial etch stop spacers 75, as measured between an inner sidewall and an outer sidewall of a respective sacrificial etch stop spacer 75, may be in a range from 10 nm to 100 nm, although lesser and greater thicknesses may also be employed.

Figure 9:
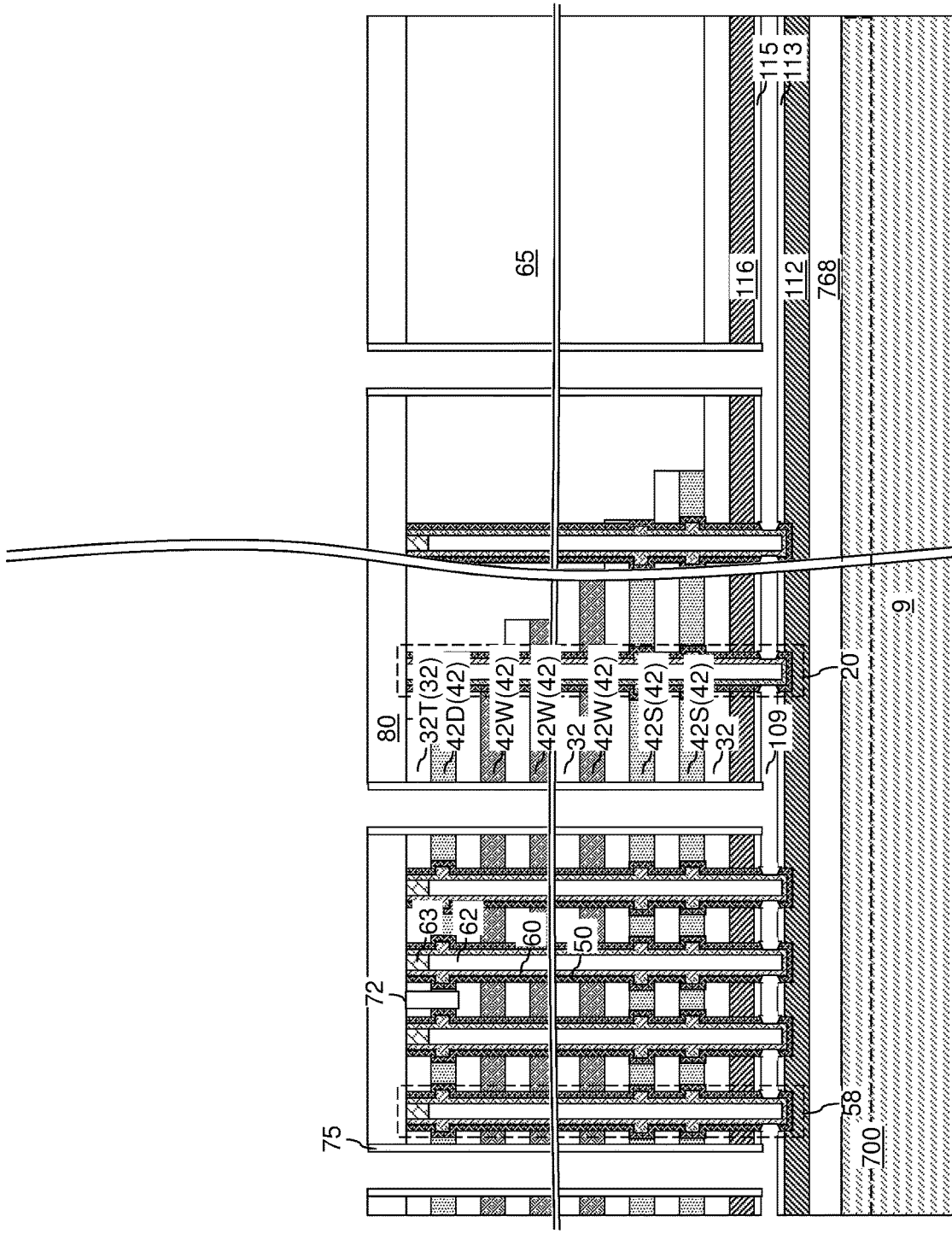
FIG. 9 is a schematic vertical cross-sectional view of the exemplary structure after formation of a substrate cavity according to an embodiment of the present disclosure.

Referring to FIG. 9, a selective isotropic etch process can be performed to etch the material of the source-level sacrificial layer 104 selective to the materials of the first and second source-level dielectric layers (113, 115), selective to the materials of the first and second source-level semiconductor layers (112, 116), and selective to the material of the sacrificial etch stop spacers 75. For example, if the source-level sacrificial layer 104 comprises silicon nitride, a wet etch process employing hot phosphoric acid may be performed to etch the source-level sacrificial layer 104 selective to the source-level semiconductor layers (112, 116), the sacrificial etch stop spacers 75, and the contact-level dielectric layer 80. If the source-level sacrificial layer 104 comprises undoped amorphous silicon, a wet etch process employing tetramethylammonium hydroxide may be performed to etch the source-level sacrificial layer 104 selective to the source-level semiconductor layers (112, 116), the sacrificial etch stop spacers 75, and the contact-level dielectric layer 80. A substrate cavity 109 can be formed in a volume from which the source-level sacrificial layer 104 is removed. The first and second source-level dielectric layers (113, 115) may be collaterally removed during the etch step.

Subsequently, a sequence of isotropic etch processes may be performed to remove physically exposed portions of the memory films 50. For example, the sequence of isotropic etch processes may sequentially etch portions of the blocking dielectric layer 52, memory material layers 54, and the dielectric material liners 56. A tubular bottom portion of each memory film 50 can be physically exposed after the sequence of isotropic etch processes. A cylindrical outer surface segment of each vertical semiconductor channel 60 can be physically exposed to the substrate cavity 109.

Figure 10:
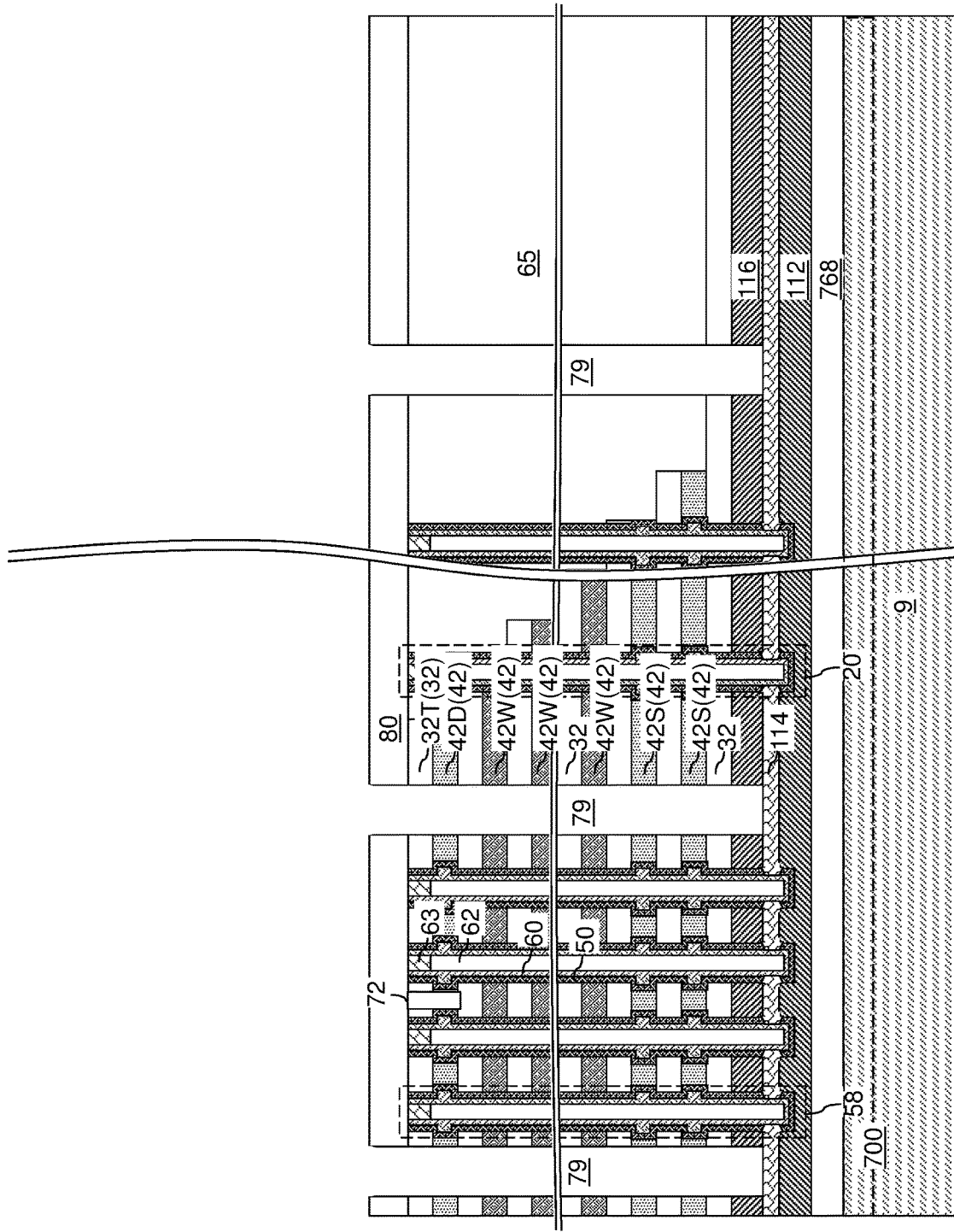
FIG. 10 is a schematic vertical cross-sectional view of the exemplary structure after formation of a horizontal source layer according to an embodiment of the present disclosure.

Referring to FIG. 10, a horizontal source layer (e.g., a discrete strap contact) can be formed in the substrate cavity 109 by depositing a doped semiconductor material having a doping of the second conductivity type in the substrate cavity 109. The horizontal source layer 114 may comprise a doped polysilicon layer containing dopants of the second conductivity type at an atomic concentration in a range from $1.0 \times 10^{18}/cm^3$ to $1.0 \times 10^{2}/cm^3$, although lesser and greater dopant concentrations may also be used.

In one embodiment, the horizontal source layer 114 may be formed by a non-selective doped semiconductor deposition process. In this case, a doped semiconductor material having a doping of the first conductivity type can be deposited on all physically exposed surfaces of the exemplary structure. The duration of the non-selective doped semiconductor deposition process can be selected such that the entire volume of the substrate cavity 109 is filled with the doped semiconductor material. An etch back process can be performed to remove portions of the doped semiconductor material that are present in the through-stack trenches 79 or above the contact-level dielectric layer 80. The etch back process may comprise an isotropic etch process or an anisotropic etch process. The remaining portion of the doped semiconductor material that fills the substrate cavity 109 constitutes the horizontal source layer 114. Optionally, a selective semiconductor deposition process may be performed to selectively deposit a semiconductor material on physically exposed surfaces of the horizontal source layer 114 such that a portion of the horizontal source layer 114 is present at a bottom of each through-stack trench 79.

The combination of the source-level semiconductor layer 112, the horizontal source layer 114, and the second source-level semiconductor layer 116 constitutes source-level material layers (112, 114, 116). Generally, the source-level material layers comprise at least one semiconductor material layer including a doped semiconductor material. In one embodiment, each of the vertical semiconductor channels 60 comprises a respective cylindrical surface in contact with a respective surface segment of the horizontal source layer 114.

Figure 11B:
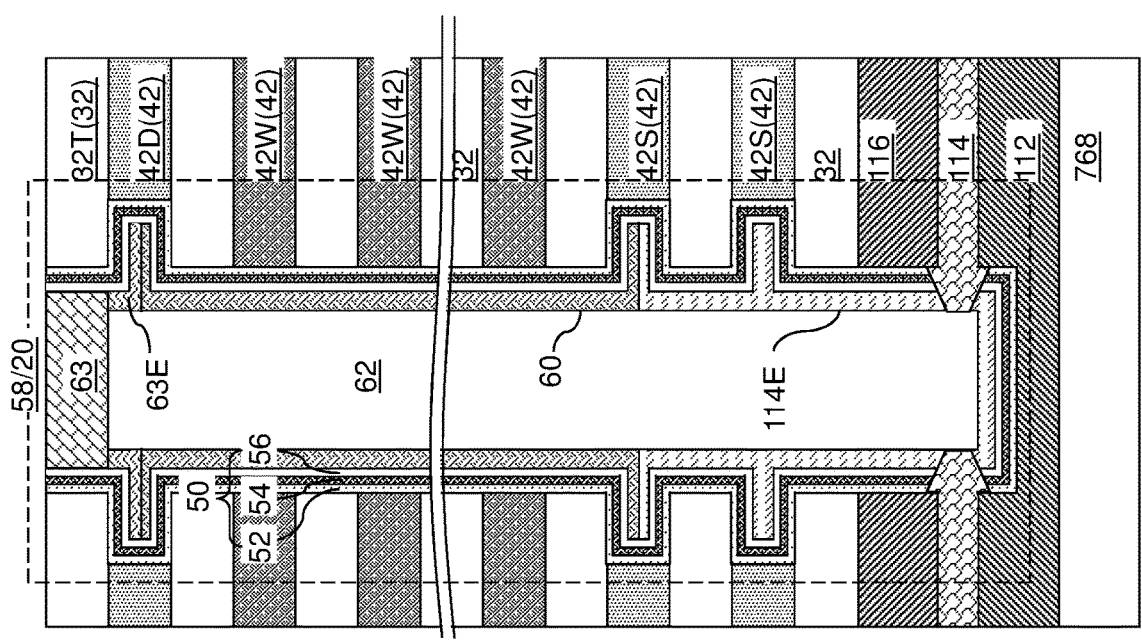
FIG. 11B is a magnified view of a region around a memory opening fill structure in an alternative configuration of the exemplary structure after performing an anneal process according to an embodiment of the present disclosure.
Figure 11A:
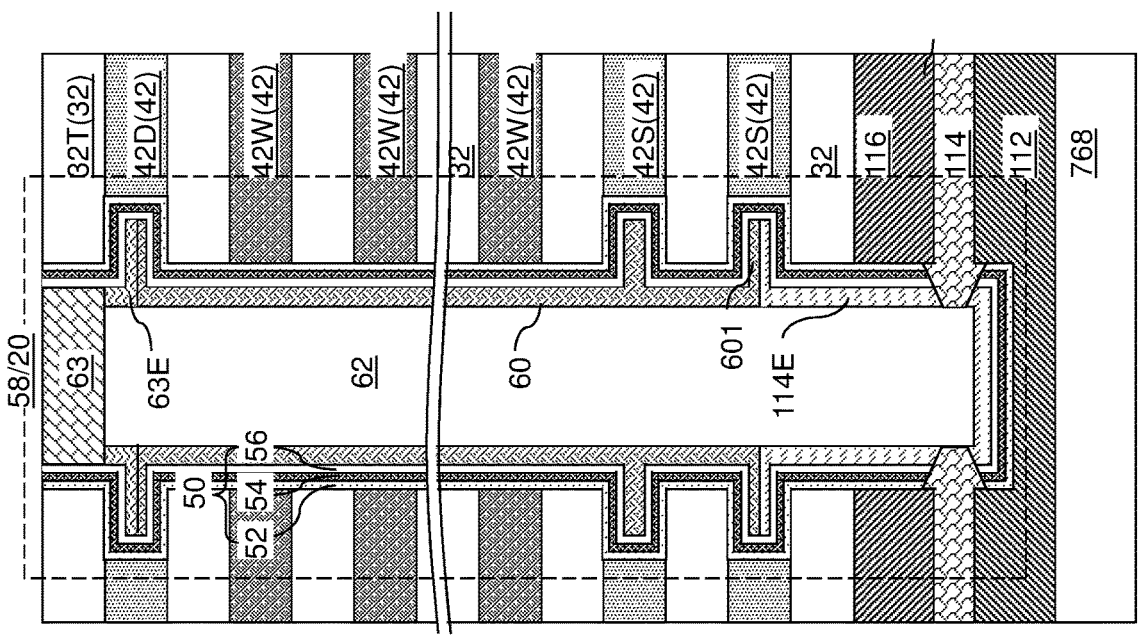
FIG. 11A is a magnified view of a region around a memory opening fill structure in the exemplary structure after performing an anneal process according to an embodiment of the present disclosure.

Referring to FIG. 11A, an anneal process can be performed to outdiffuse dopants of the second conductivity type from the horizontal source layer 114 into lower portions of the vertical semiconductor channels 60. The dopants of the second conductivity type convert the bottom portion of the vertical semiconductor channel 60 into a source extension region 114E. The atomic concentration of dopants of the first conductivity type in the source-side doped channel portion 60S may be in a range from $1.0 \times 10^{16}/cm^3$ to $1.0 \times 10^{18}/cm^3$, although lesser and greater dopant concentrations may also be used.

An interface between the source extension region 114 and the vertical semiconductor channel may be formed within a laterally-protruding portion 601 of the vertical semiconductor channel 60 that is located at one of the source-select-level sacrificial material layers 42S, such as the level of a bottommost source-select-level sacrificial material layer 42S, as illustrated in FIG. 11A. Alternatively, the interface may be formed at a level of any source-select-level sacrificial material layer 42S that overlies the bottommost source-select-level sacrificial material layer 42S, as illustrated in FIG. 11B.

Figure 12:
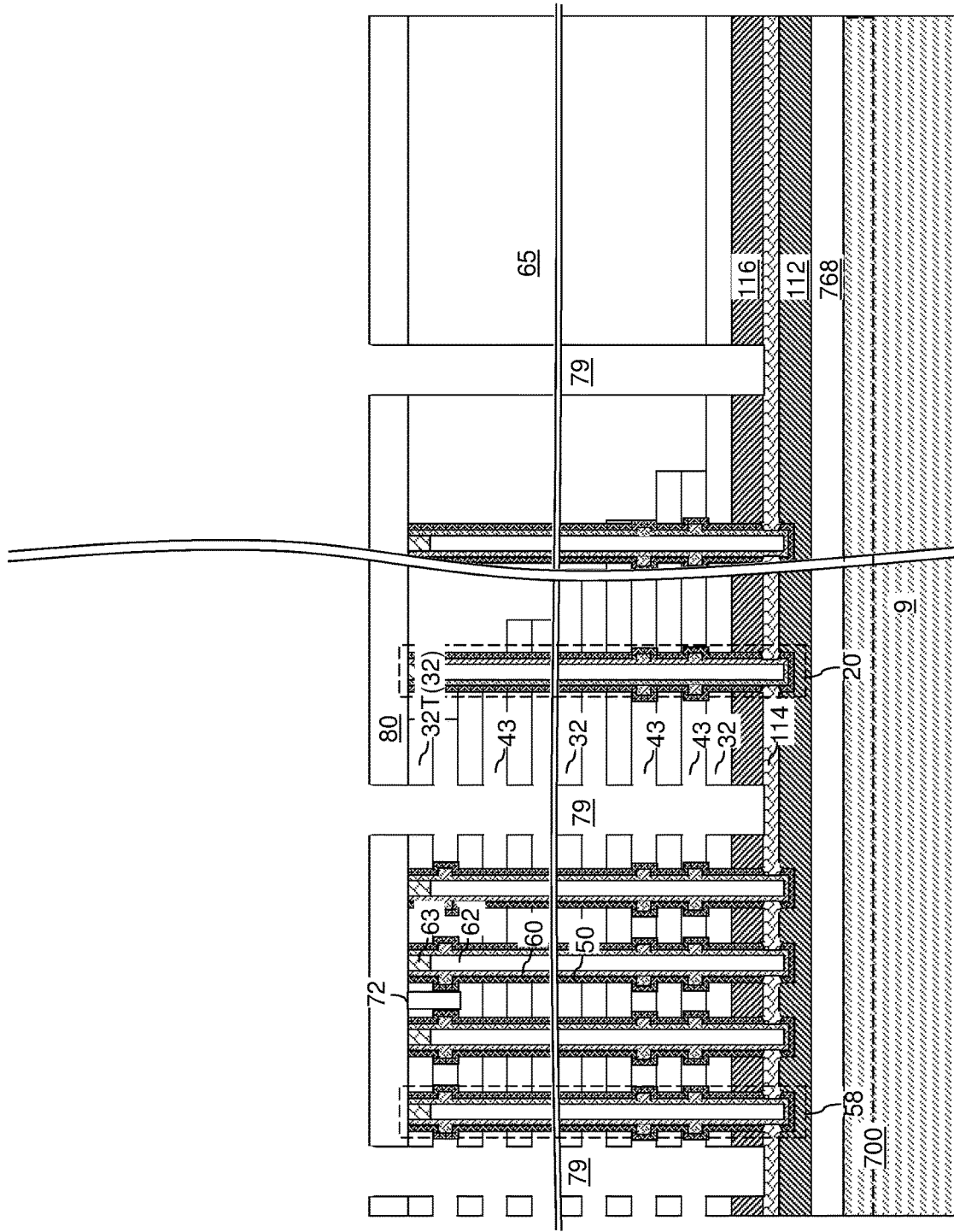
FIG. 12 is a schematic vertical cross-sectional view of the exemplary structure after removal of the sacrificial etch stop spacers and formation of backside recesses according to an embodiment of the present disclosure.

Referring to FIG. 12, the sacrificial etch stop spacers 75 may be removed by selective etching. Thereafter, an etchant that selectively etches the second material of the sacrificial material layers 42 with respect to the first material of the insulating layers 32 can be introduced into the through-stack trenches 79, for example. Backside recesses 43 are formed in volumes from which the sacrificial material layers 42 are removed. The removal of the second material of the sacrificial material layers 42 can be selective to the material of the insulating layers 32, the material of the stepped dielectric material portion 65, the semiconductor materials of the horizontal source layer 114 and the second source-level semiconductor layer 116, and the material of the outermost layer of the memory films 50. In one embodiment, the sacrificial material layers 42 can include silicon nitride, and the materials of the insulating layers 32 and the stepped dielectric material portion 65 can be silicon oxide.

The etch process that removes the second material selective to the first material and the outermost layer of the memory films 50 can be a wet etch process using a wet etch solution, or can be a gas phase (dry) etch process in which the etchant is introduced in a vapor phase into the through-stack trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42. Generally, the backside recesses 43 can be formed by removing the sacrificial material layers 42 selective to the insulating layers 32 and the memory opening fill structures 58.

Figure 13:
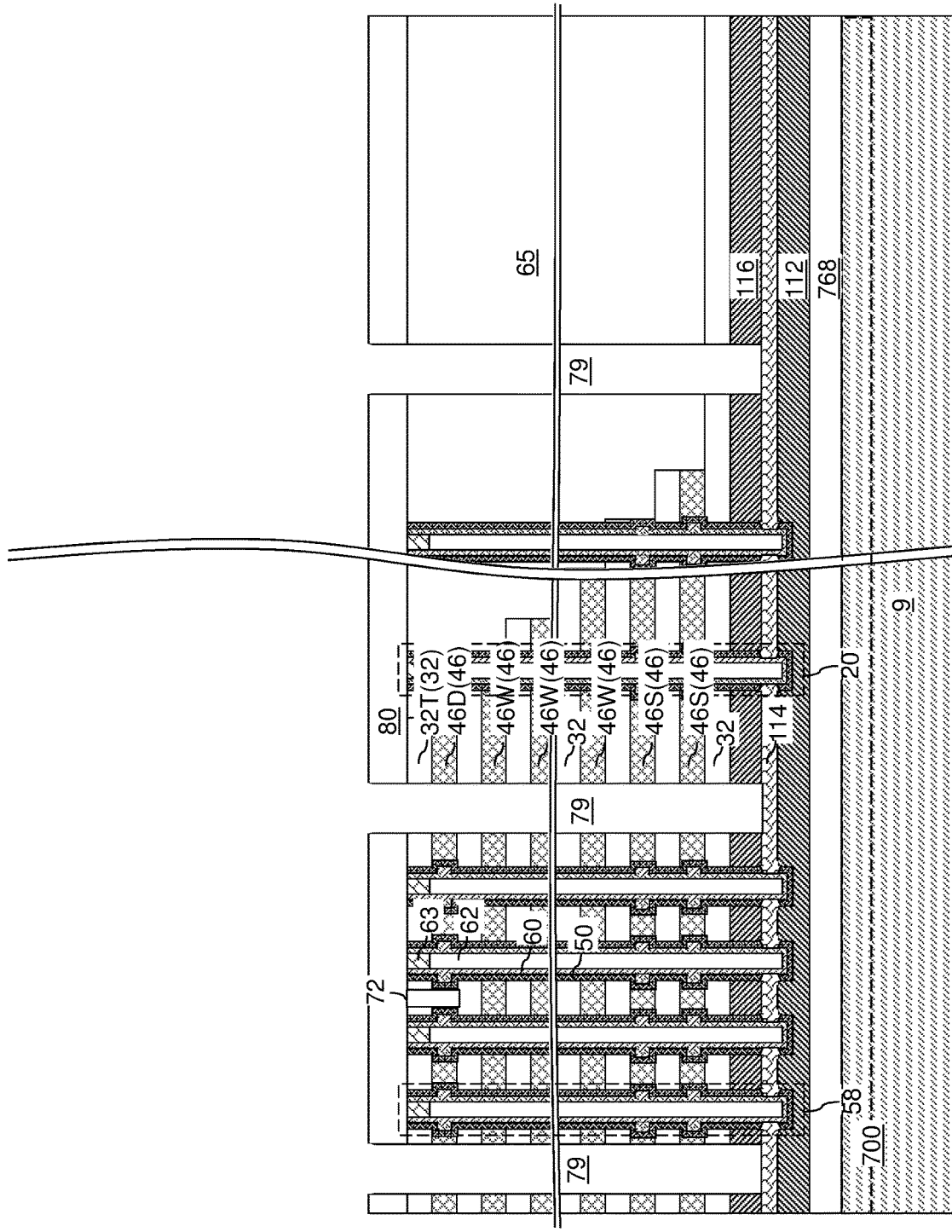
FIG. 13 is a schematic vertical cross-sectional view of the exemplary structure after formation of electrically conductive layers according to an embodiment of the present disclosure.

Referring to FIG. 13, an optional backside blocking dielectric layer (not shown) can be optionally formed in the backside recesses 43 and the trenches 79 by a conformal deposition on physically exposed surfaces of the memory opening fill structures 58, the support pillar structures 20, the insulating layers 32, the contact-level dielectric layer 80, the horizontal source layer 114, and the second source-level semiconductor layer 116. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

At least one conductive material may be deposited in the plurality of backside recesses, on the sidewalls of the through-stack trenches 79, and over the contact-level dielectric layer 80. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers 46 may be formed in the backside recesses 43 by deposition of the at least one conductive material. A plurality of electrically conductive layers 46 may be formed in the plurality of backside recesses 43, and a continuous metallic material layer (not shown) may be formed on the sidewalls of each through-stack trench 79 and over the contact-level dielectric layer 80. Each of the electrically conductive layers may include a respective conductive metallic nitride liner and a respective conductive fill material. Thus, the and second sacrificial material layers 42 may be replaced with the electrically conductive layers 46. Specifically, each sacrificial material layer 42 may be replaced with an optional portion of the backside blocking dielectric layer and an electrically conductive layer 46. A backside cavity is present in the portion of each through-stack trench 79 that is not filled with the continuous metallic material layer.

Residual conductive material may be removed from inside the through-stack trenches 79. Specifically, the deposited metallic material of the continuous metallic material layer may be etched back from the sidewalls of each through-stack trench 79 and from above the contact-level dielectric layer 80, for example, by an anisotropic or isotropic etch. Each remaining portion of the deposited metallic material in the backside recesses 43 constitutes an electrically conductive layer 46. Sidewalls of the electrically conductive material layers 46 may be physically exposed to a respective through-stack trench 79.

The electrically conductive layers 46 may comprise, from bottom to top, at least one source-select-level electrically conductive layer (i.e., source side select gate electrode) 46S, word-line-level electrically conductive layers (i.e., word lines) 46W, and at least one drain-select-level electrically conductive layer (i.e., drain side select gate electrode) 46D. Each source-select-level electrically conductive layer 46S replaces a respective source-select-level sacrificial material layer 42S. Each word-line-level electrically conductive layer 46W replaces a respective word-line-level sacrificial material layer 42W. Each drain-select-level sacrificial material layer 46D replaces a respective drain-select-level sacrificial material layer 42D.

Each electrically conductive layer 46 may be a conductive sheet including openings therein. A subset of the openings through each electrically conductive layer 46 may be filled with memory opening fill structures 58. A second subset of the openings through each electrically conductive layer 46 may be filled with the support pillar structures 20. A subset of the electrically conductive layers 46 may comprise word lines for the memory elements.

The lateral extents of the electrically conductive layers 46 decrease with a vertical distance from the source-level material layers (112, 114, 116). The dielectric material portion 65 contacts stepped surfaces of the alternating stack (32, 46), and has a variable lateral extent that increases stepwise with a vertical distance from a horizontal plane including an interface between the alternating stack (32, 46) and the source-level material layers (112, 114, 116).

Figure 14B:
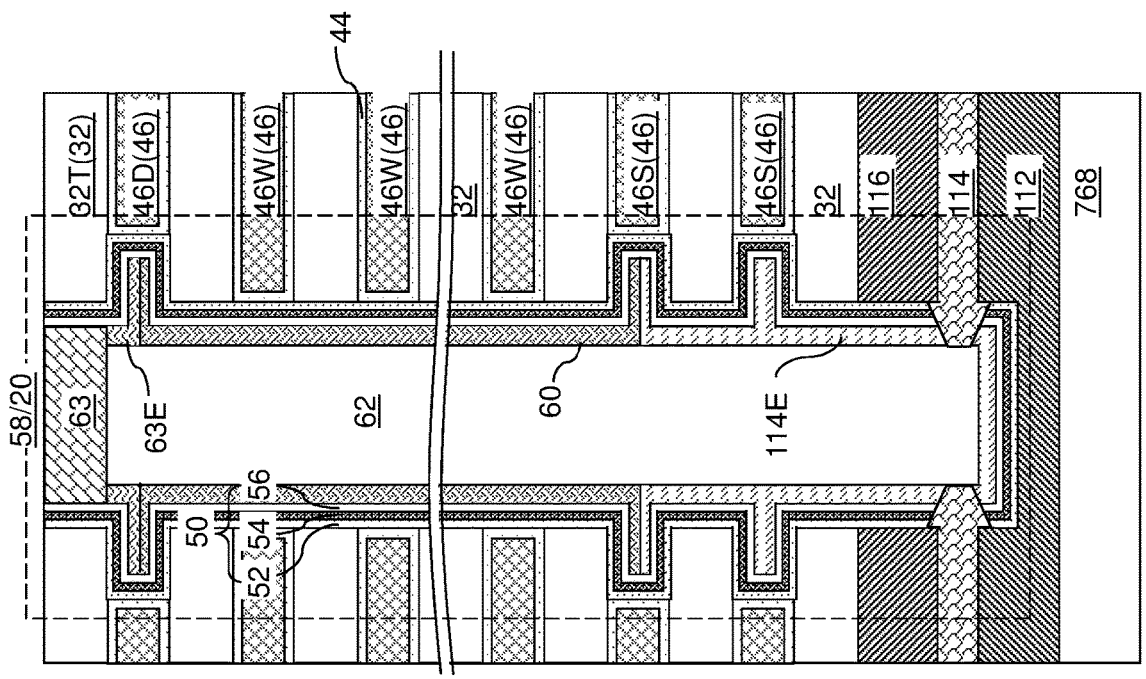
FIG. 14B is a magnified view of a region around a memory opening fill structure in an alternative configuration of the exemplary structure of FIG. 13.
Figure 14A:
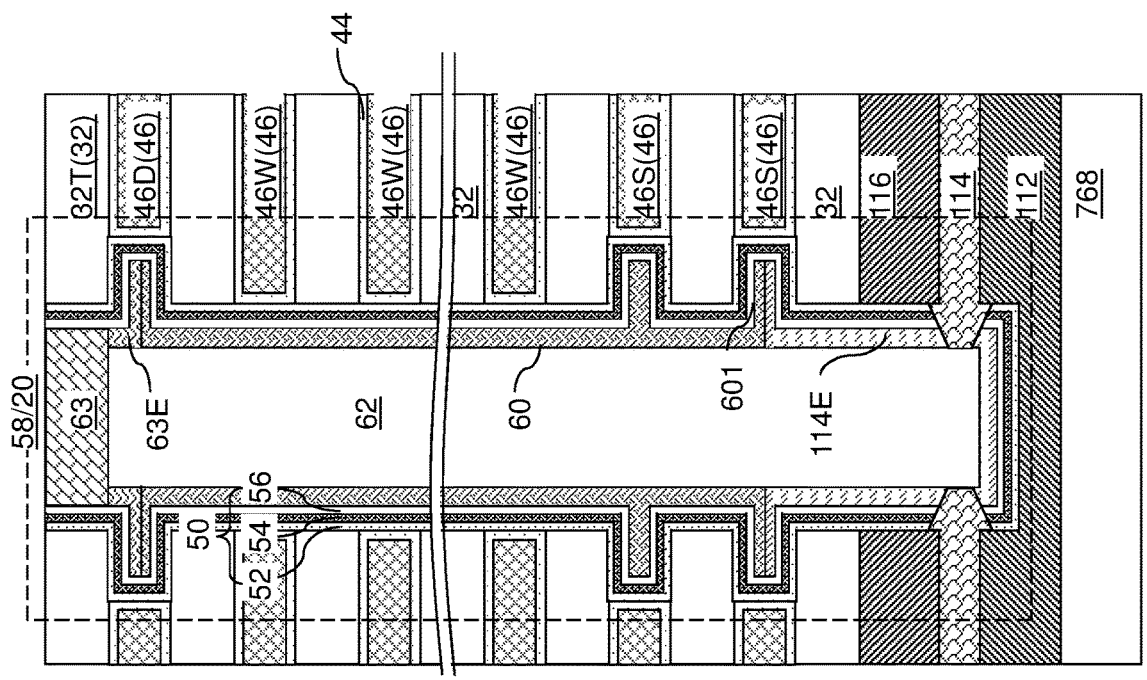
FIG. 14A is a magnified view of a region around a memory opening fill structure in the exemplary structure of FIG. 13.

FIG. 14A illustrates a region including a memory opening fill structure 58 or a support opening fill structure 20 of the exemplary structure after the processing steps of FIG. 13. FIG. 14B illustrates a region including a memory opening fill structure or a support opening fill structure 20 of an alternative embodiment of the exemplary structure after the processing steps of FIG. 13.

Figure 15:
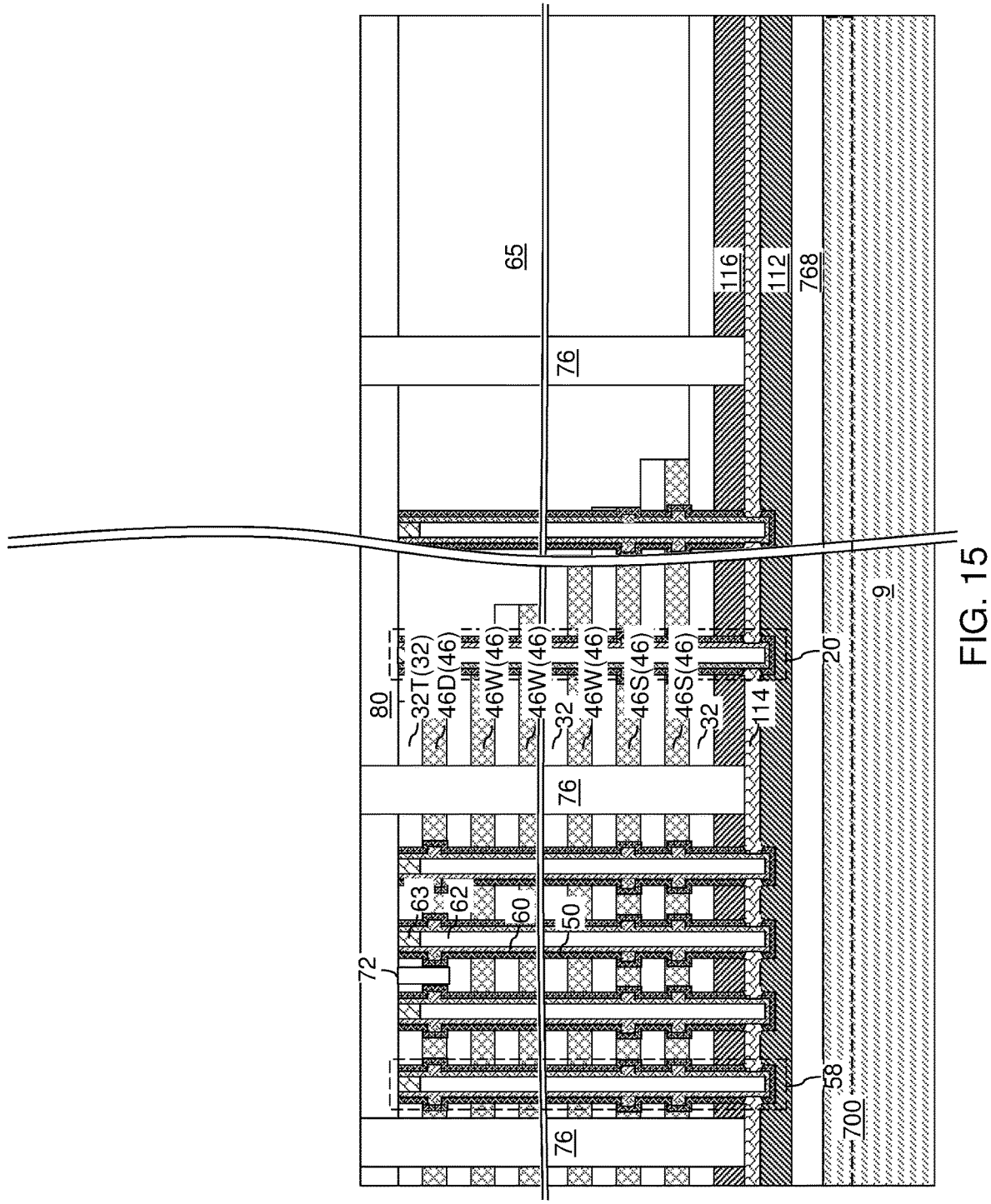
FIG. 15 is a schematic vertical cross-sectional view of the exemplary structure after formation of trench fill dielectric structures according to an embodiment of the present disclosure.

Referring to FIG. 15, a dielectric fill material, such as silicon oxide, can be deposited in the portions of the through-stack trenches 79. A recess etch process can be performed to remove portions of the dielectric fill material that are deposited over the contact-level dielectric layer 80. Remaining portions of the dielectric fill material that fill portions of the through-stack trenches 79 constitute trench dielectric fill structures 76. In one embodiment, a dielectric trench fill structure 76 can contact a sidewall of the dielectric material portion 65, and a sidewall of at least one electrically conductive layer 46 of the electrically conductive layers 46.

Figure 16A:
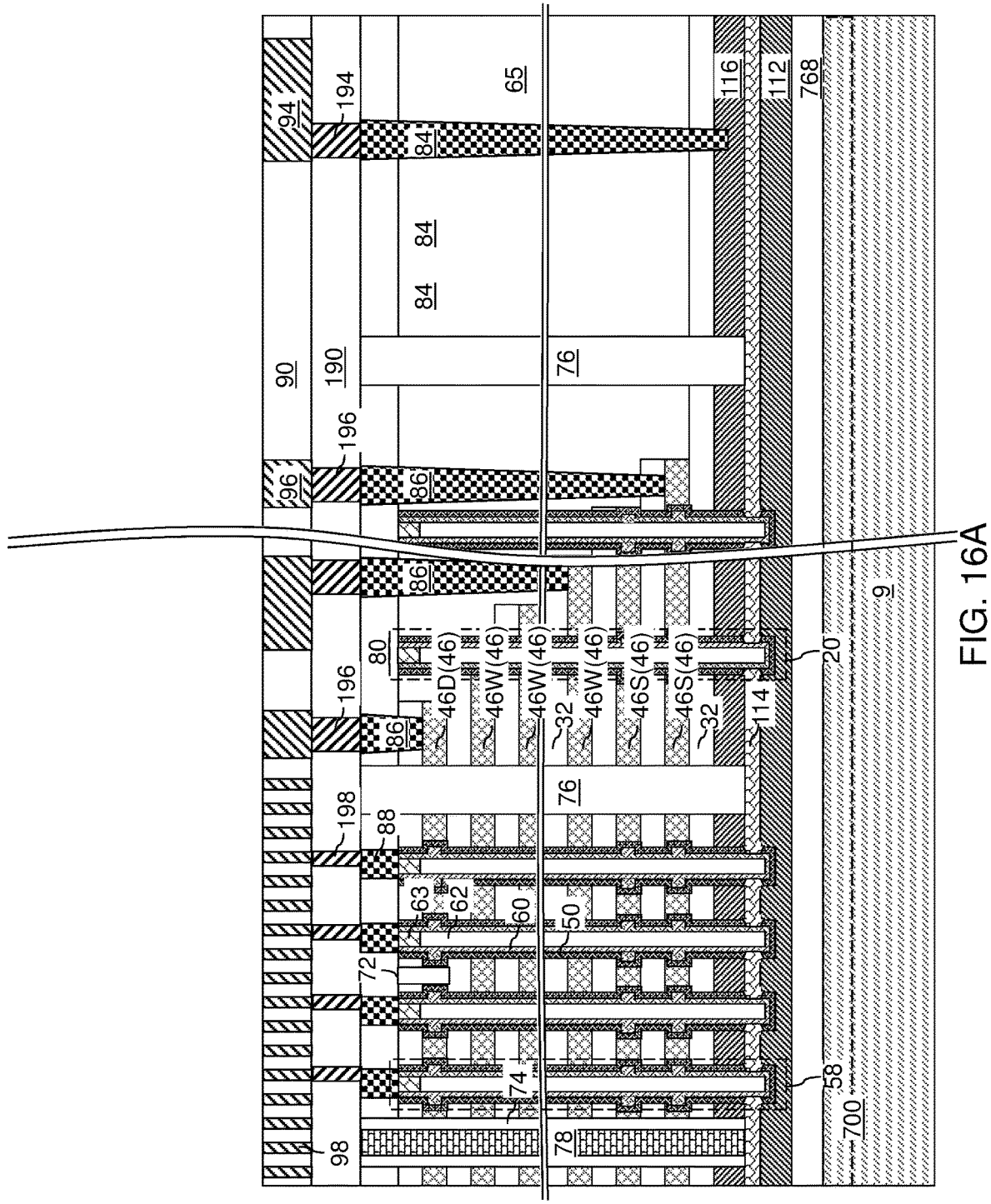
FIG. 16A is a schematic vertical cross-sectional view of the exemplary structure after formation of additional contact via structures, connection via structures, and bit-line-level metal lines according to an embodiment of the present disclosure.
Figure 16B:
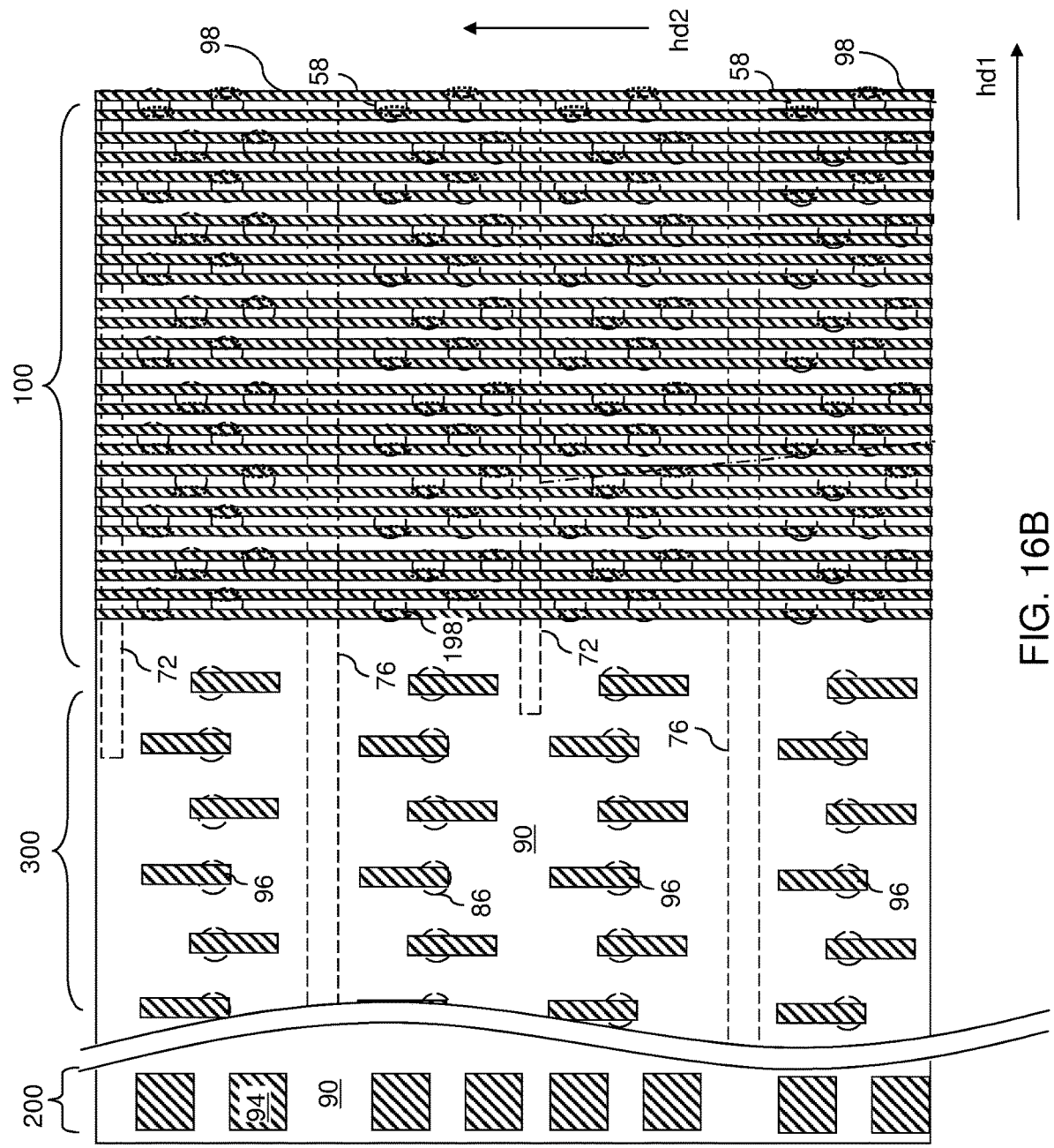
FIG. 16B is a partial see-through top-down view of the exemplary structure of FIG. 16A. The vertical plane A-A' is the plane of the schematic vertical cross-sectional view of FIG. 16A.

Referring to FIGS. 16A and 16B, various via cavities can be formed through the contact-level dielectric layer 80 and the stepped dielectric material portion 65. The via cavities may comprise drain contact via cavities extending down to a respective drain region 63 in the memory opening fill structures 58, layer contact via cavities extending down to a respective electrically conductive layer 46 at, or underneath, the stepped surfaces of the alternating stack (32, 46) underneath the stepped dielectric material portion 65, and connection via cavities extending down to the source-level material layers (112, 114, 116).

At least one conductive material can be deposited in each of the via cavities, and excess portions of the at least one conductive material can be removed from above the horizontal plane including the top surface of the contact-level dielectric layer 80. Each remaining portion of the at least one conductive material constitutes a via structure (88, 86, 84). The via structures (88 86, 84) comprise drain contact via structures 88 formed in the drain contact via cavities and contacting a top surface of a respective one of the drain regions 63. Thus, the drain contact via structures 88 vertically extend through the contact-level dielectric layer 80 and contact an end surface of a respective one of the memory opening fill structures 58. The via structures (88, 86, 84) further comprise layer contact via structures 86 formed in the layer contact via cavities and contacting a top surface of a respective one of the electrically conductive layers 46. The via structures (88, 86, 84) further comprise at least one connection via structures 84 formed in the connection via cavities and contacting the source-level material layers (112, 114, 116).

Figure 17B:
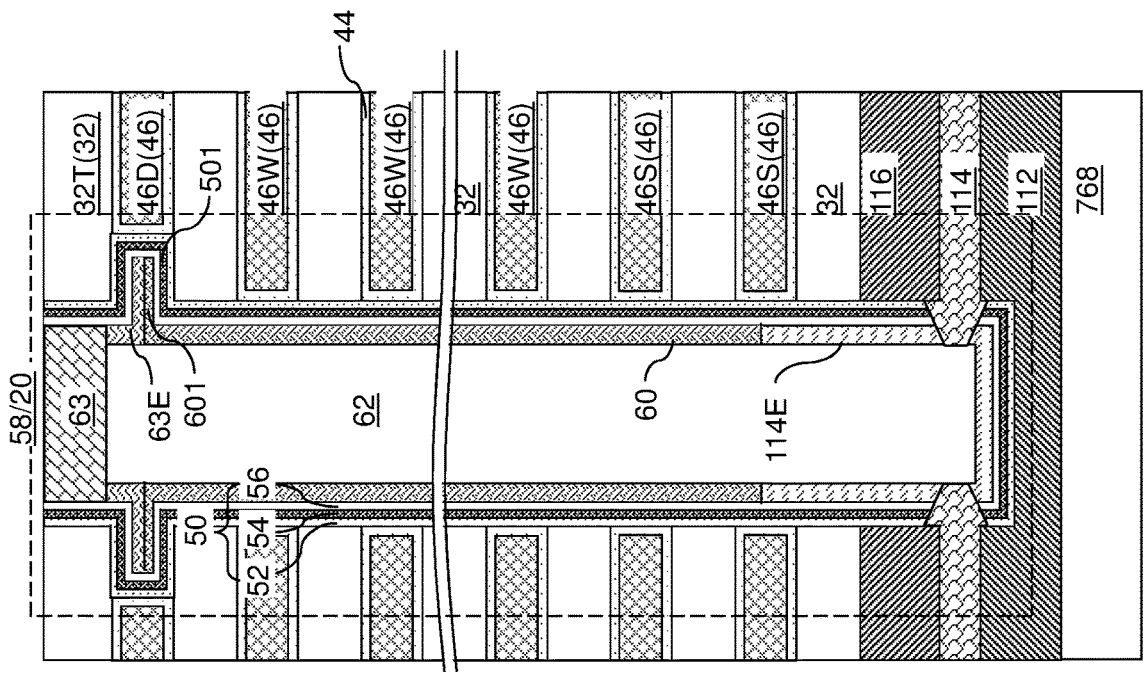
FIG. 17B is a schematic vertical cross-sectional view of the first alternative configuration of a memory opening fill structure after replacement of sacrificial material layers with electrically conductive layers according to an embodiment of the present disclosure.
Figure 17A:
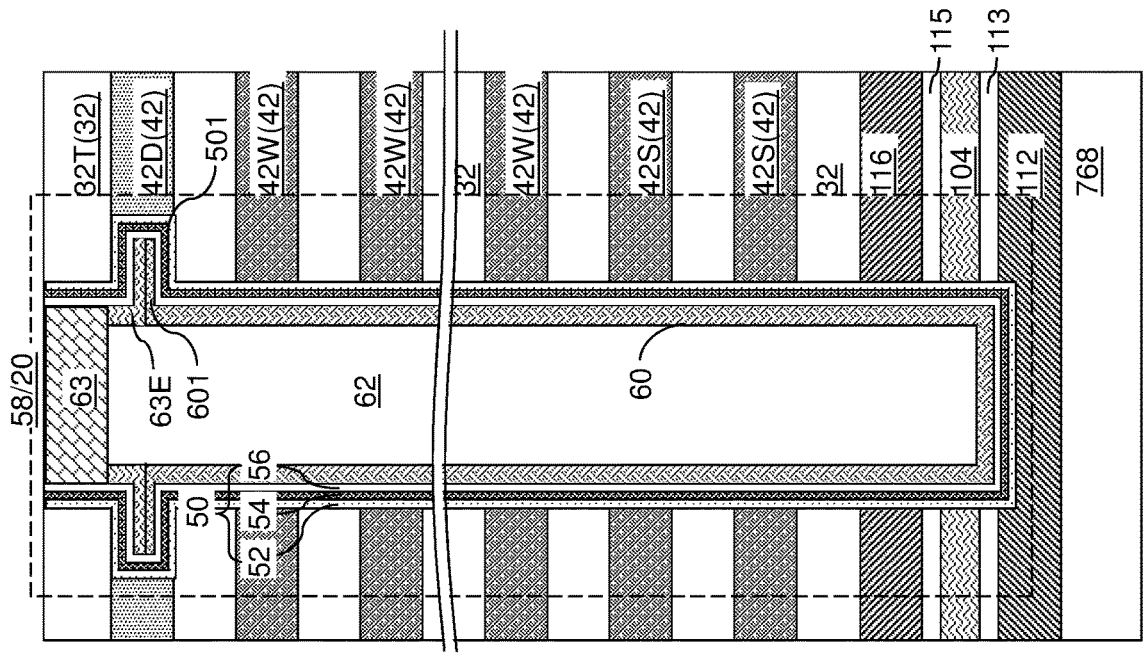
FIG. 17A is a schematic vertical cross-sectional view of a first alternative configuration of a memory opening fill structure immediately after formation of the memory opening fill structure according to an embodiment of the present disclosure.

Referring to FIG. 17A, a first alternative configuration of a memory opening fill structure 58 is illustrated immediately after formation of the memory opening fill structure 58 according to an embodiment of the present disclosure. The processing step of FIG. 17A corresponds to the processing step of FIG. 5I. In the first alternative configuration, the word-line-level sacrificial material layers 42W and the source-select-level sacrificial material layers 42S comprises the first sacrificial material, and the drain-select-level sacrificial material layers 42D comprise the second sacrificial material. Thus, the annular recess cavities 49R are formed at a processing step that corresponds to the processing step of FIG. 5B only at the level(s) of the at least one drain-select-level sacrificial material layers 42D. Accordingly, lateral protrusion(s) 501 in the memory film 50 is/are formed only at the level(s) of the at least one drain-select-level sacrificial material layers 42D. Further, lateral protrusion(s) 601 of the vertical semiconductor channel 60 is/are formed only at the level(s) of the at least one drain-select-level sacrificial material layers 42D.

Referring to FIG. 17B, the first alternative configuration of a memory opening fill structure 58 is illustrated after replacement of sacrificial material layers 42 with electrically conductive layers 46 according to an embodiment of the present disclosure. The processing step of FIG. 17B corresponds to the processing step of FIG. 14A. Lateral protrusion(s) 501 in the memory film 50 is/are formed only at the level(s) of the at least one drain-select-level electrically conductive layer 46D. Further, lateral protrusion(s) 601 of the vertical semiconductor channel 60 is/are formed only at the level(s) of the at least one drain-select-level electrically conductive layer 46D.

Figure 18B:
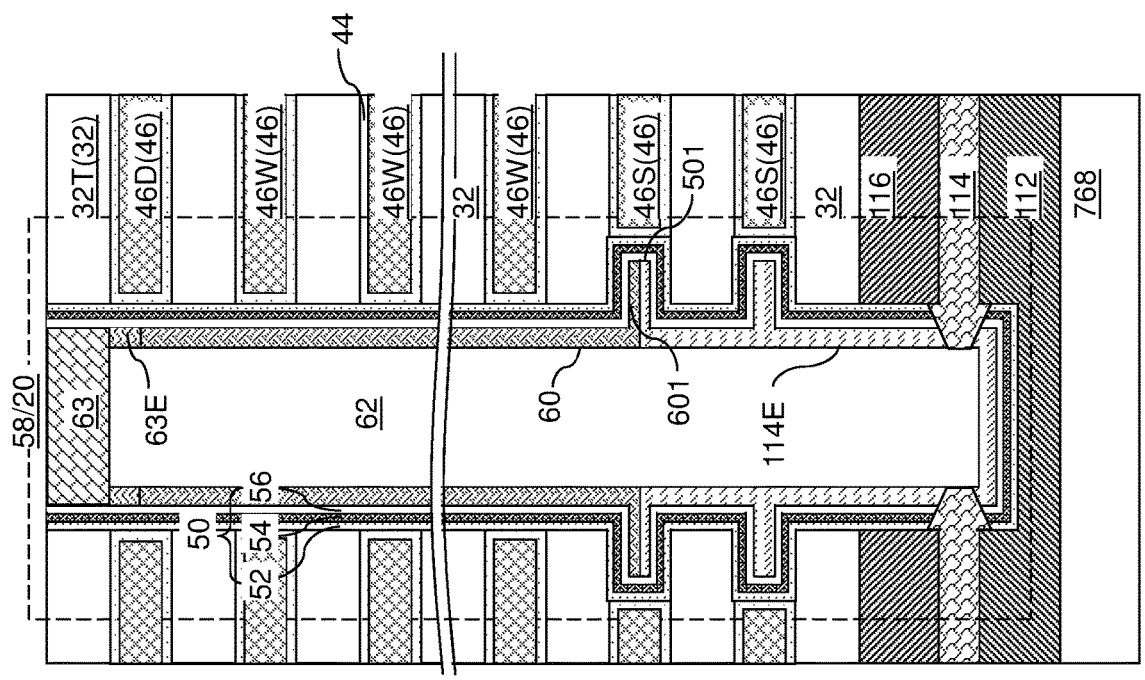
FIG. 18B is a schematic vertical cross-sectional view of the second alternative configuration of a memory opening fill structure after replacement of sacrificial material layers with electrically conductive layers according to an embodiment of the present disclosure.
Figure 18A:
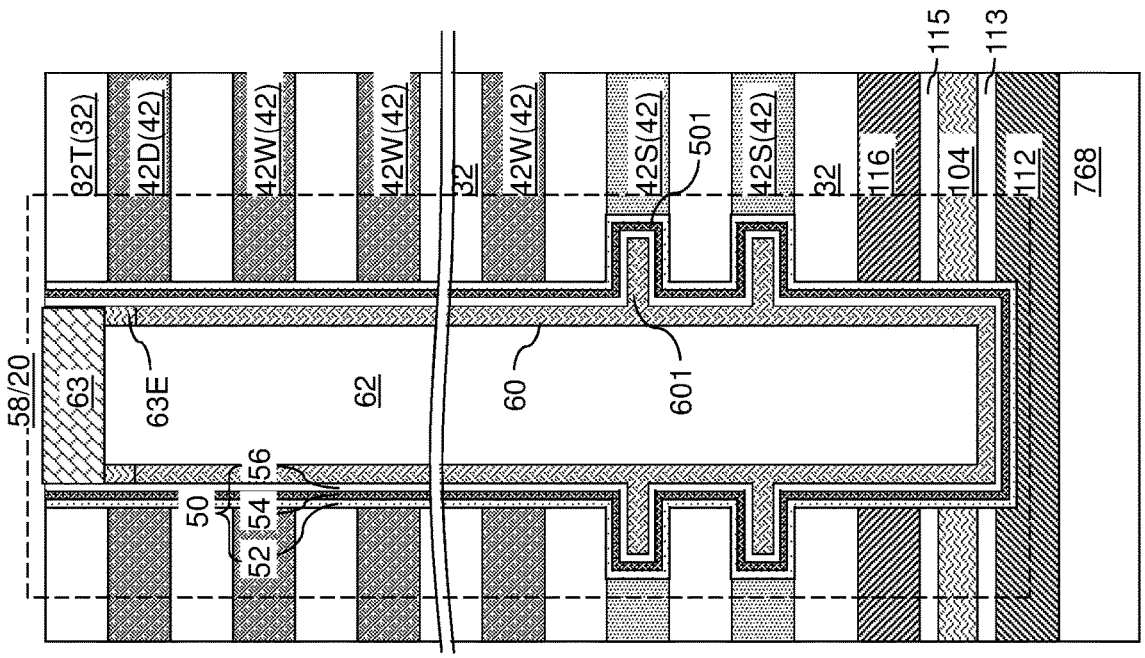
FIG. 18A is a schematic vertical cross-sectional view of a second alternative configuration of a memory opening fill structure immediately after formation of the memory opening fill structure according to an embodiment of the present disclosure.

Referring to FIG. 18A, a second alternative configuration of a memory opening fill structure 58 is illustrated immediately after formation of the memory opening fill structure 58 according to an embodiment of the present disclosure. The processing step of FIG. 18A corresponds to the processing step of FIG. 5I. In the second alternative configuration, the word-line-level sacrificial material layers 42W and the drain-select-level sacrificial material layers 42D comprises the first sacrificial material, and the source-select-level sacrificial material layers 42S comprise the second sacrificial material. Thus, the annular recess cavities 49R are formed at a processing step that corresponds to the processing step of FIG. 5B only at the level(s) of the at least one source-select-level sacrificial material layers 42S. Accordingly, lateral protrusion(s) 501 in the memory film 50 is/are formed only at the level(s) of the at least one source-select-level sacrificial material layers 42S. Further, lateral protrusion(s) 601 of the vertical semiconductor channel 60 is/are formed only at the level(s) of the at least one source-select-level sacrificial material layers 42D.

Referring to FIG. 18B, the second alternative configuration of a memory opening fill structure 58 is illustrated after replacement of sacrificial material layers 42 with electrically conductive layers 46 according to an embodiment of the present disclosure. The processing step of FIG. 18B corresponds to the processing step of FIG. 14A. Lateral protrusion(s) 501 in the memory film 50 is/are formed only at the level(s) of the at least one source-select-level electrically conductive layer 46S. Further, lateral protrusion(s) 601 of the vertical semiconductor channel 60 is/are formed only at the level(s) of the at least one source-select-level electrically conductive layer 46S.

Referring to all drawings and according to various embodiments of the present disclosure, a semiconductor structure is provided, which comprises: an alternating stack (32, 46) of insulating layers 32 and electrically conductive layers 46, wherein the electrically conductive layers 46 comprise word line electrically conductive layers 46W and a first select-level electrically conductive layer (46S, 46D); a memory opening 49 vertically extending through the alternating stack (32, 46); and a memory opening fill structure 58 located in the memory opening 49 and comprising a memory film 50 and a vertical semiconductor channel 60. A vertical cross-sectional profile of an outer sidewall of the vertical semiconductor channel 60 is straight throughout the word line electrically conductive layers 46W and comprises a lateral protrusion 601 at a level of the first select-level electrically conductive layer (46S, 46D).

In one embodiment, a vertical cross-sectional profile of an outer sidewall of the memory film 50 is straight throughout the word line electrically conductive layers 46W, and comprises a first lateral protrusion 501 at the level of the first select-level electrically conductive layer (46S, 46D), and the lateral protrusion 601 in the vertical semiconductor channel 60 comprises a second lateral protrusion.

In one embodiment, the vertical cross-sectional profile of an inner sidewall of the vertical semiconductor channel 60 is straight throughout the word line electrically conductive layers 46W and throughout each of the first select-level electrically conductive layer (46S, 46D).

In one embodiment, a vertical extent of the first lateral protrusion is the same as a vertical spacing between an overlying insulating layer 32 of the insulating layers 32 that contacts an annular top surface of the first lateral protrusion and an underlying insulating layer 32 of the insulating layers 32 that contacts an annular bottom surface of the first lateral protrusion.

In one embodiment, the memory film 50 has a uniform thickness in vertically-extending segments within the first lateral protrusion 501, in horizontally-extending segments within the first lateral protrusion 501, and in portions that extend straight throughout the word line electrically conductive layers 46W; and a vertical extent of the second lateral protrusion 601 is the same as the vertical extent of the first lateral protrusion 501 less twice the uniform thickness of the memory film 50. In one embodiment, the memory film 50 is continuous throughout the entire alternating stack (32, 46), and lacks discrete, vertically isolated regions.

In one embodiment, the vertical semiconductor channel 60 comprises dopants of the first conductivity type. In one embodiment, the memory opening fill structure 58 further comprises a drain region 63 located at an upper end of the vertical semiconductor channel 60 and including dopants of a second conductivity type that is an opposite of the first conductivity type. In one embodiment, a drain extension region 63E is adjoined to the drain region 63 and forms a first p-n junction at a first interface with the vertical semiconductor channel 60.

In one embodiment, a horizontal source layer 114 including dopants of the second conductivity type contacts cylindrical surface segment of a lower portion of the vertical semiconductor channel 60. A vertical source extension region 114E is adjoined to the horizontal source layer 114 and forms a second p-n junction at a second interface with the vertical semiconductor channel 60.

In one embodiment, the first select-level electrically conductive layer comprises a drain side select gate electrode 46D, and the lateral protrusion 601 is located at the drain side select gate electrode. In another embodiment, the first select-level electrically conductive layer comprises a source side select gate electrode 46S, and the lateral protrusion 601 is located at the source side select gate electrode. In one embodiment, the vertical semiconductor channel 60 further comprises another protrusion 601 located at a level of a drain side select gate electrode 46D.

In one embodiment, the vertical semiconductor channel 60 comprises a uniform thickness portion having a uniform lateral thickness between a straight inner sidewall segment and the straight outer sidewall segment throughout the word line electrically conductive layers 46W, while the lateral protrusion portion 601 has a lateral thickness between the outer sidewall and the inner sidewall that is greater than the uniform lateral thickness.

The various embodiments of the present disclosure can provide a locally thickened vertical semiconductor channel 60 that includes at least one lateral protrusion 601 at one or more source select levels and/or at one or more drain select levels. The protrusion(s) and the drain and/or source extension regions (63E, 114E) employed to increase a gate-induced drain leakage (GIDL) current and reduce erase voltage variations. The increase in the GIDL current can increase the speed at which electrical charge (e.g., holes) are supplied into the vertical semiconductor channel 60 during an erase operation of the memory cells in the memory material layer 54 which store electrons at the levels of the word lines 42W. Thus, the locally thickened vertical semiconductor channel 60 of the embodiments of the present disclosure can be advantageously employed to increase the operational speed of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
an alternating stack of insulating layers and electrically conductive layers, wherein the electrically conductive layers comprise word line electrically conductive layers and a first select-level electrically conductive layer;
a memory opening vertically extending through the alternating stack; and
a memory opening fill structure located in the memory opening and comprising a memory film and a vertical semiconductor channel,
wherein the vertical semiconductor channel has a first uniform radial thickness throughout an entirety of the word line electrically conductive layers that extends from a first horizontal plane including a bottom surface of a bottommost electrically conductive layer of the word line electrically conductive layers to a second horizontal plane including a top surface of a topmost electrically conductive layer of the word line electrically conductive layers;

wherein the vertical semiconductor channel has a second uniform radial thickness at a level of the first select-level electrically conductive layer, the second uniform radial thickness being greater than the first uniform radial thickness; and wherein a vertical cross-sectional profile of an inner sidewall of the vertical semiconductor channel is straight from a topmost portion to a bottommost portion of the memory opening fill structure throughout the word line electrically conductive layers and throughout the select-level electrically conductive layer.

2. The semiconductor structure of claim 1, wherein:

a vertical cross-sectional profile of an outer sidewall of the memory film is straight throughout the word line electrically conductive layers, and comprises a first lateral protrusion at the level of the first select-level electrically conductive layer; and the lateral protrusion in the vertical semiconductor channel comprises a second lateral protrusion.

3. The semiconductor structure of claim 2, wherein a vertical extent of the first lateral protrusion is the same as a vertical spacing between an overlying insulating layer of the insulating layers that contacts an annular top surface of the first lateral protrusion and an underlying insulating layer of the insulating layers that contacts an annular bottom surface of the first lateral protrusion.

4. The semiconductor structure of claim 3, wherein:

the memory film has a uniform thickness in vertically-extending segments within the first lateral protrusion, in horizontally-extending segments within the first lateral protrusion, and in portions that extend straight throughout the word line electrically conductive layers; and a vertical extent of the second lateral protrusion is the same as the vertical extent of the first lateral protrusion less twice the uniform thickness of the memory film.

5. The semiconductor structure of claim 2, wherein the memory film is continuous throughout the entire alternating stack.

6. The semiconductor structure of claim 1, wherein the vertical semiconductor channel comprises dopants of a first conductivity type.

7. The semiconductor structure of claim 6, wherein the memory opening fill structure further comprises a drain region located at an upper end of the vertical semiconductor channel and including dopants of a second conductivity type that is an opposite of the first conductivity type.

8. The semiconductor structure of claim 7, further comprising a drain extension region which is adjoined to the drain region and forms a first p-n junction at a first interface with the vertical semiconductor channel.

9. The semiconductor structure of claim 8, further comprising a horizontal source layer including dopants of the second conductivity type which contacts cylindrical surface segment of a lower portion of the vertical semiconductor channel.

10. The semiconductor structure of claim 9, further comprising a vertical source extension region which is adjoined to the horizontal source layer and forms a second p-n junction at a second interface with the vertical semiconductor channel.

11. The semiconductor structure of claim 1, wherein the first select-level electrically conductive layer comprises a drain side select gate electrode, and the lateral protrusion is located at the drain side select gate electrode.

12. The semiconductor structure of claim 1, wherein the first select-level electrically conductive layer comprises a source side select gate electrode, and the lateral protrusion is located at the source side select gate electrode.

13. The semiconductor structure of claim 12, wherein the vertical semiconductor channel further comprises another protrusion located at a level of a drain side select gate electrode.

14. The semiconductor structure of claim 1, wherein the vertical cross-sectional profile of the inner sidewall of the vertical semiconductor channel is straight throughout the entirety of the vertical extent that extends from the first horizontal plane to the second horizontal plane.

15. The semiconductor structure of claim 1, wherein a vertical cross-sectional profile of an outer sidewall of the memory film is straight throughout the entirety of the vertical extent that extends from the first horizontal plane to the second horizontal plane.

16. The semiconductor structure of claim 1, wherein a vertical cross-sectional profile of an inner sidewall of the memory film is straight throughout the entirety of the vertical extent that extends from the first horizontal plane to the second horizontal plane.

17. The semiconductor structure of claim 1, wherein the vertical semiconductor channel has a uniform lateral thickness throughout the entirety of the vertical extent that extends from the first horizontal plane to the second horizontal plane.

18. The semiconductor structure of claim 17, wherein the vertical semiconductor channel has a greater lateral thickness at the level of the first select-level electrically conductive layer than at levels of the word line electrically conductive layers.

19. The semiconductor structure of claim 1, wherein:

the vertical semiconductor channel consists essentially of a single layer of doped polysilicon or amorphous silicon that has the first uniform radial thickness throughout the word line electrically conductive layers and the second uniform radial thickness at the level of the first select-level electrically conductive layer; and a vertical cross-sectional profile of an outer sidewall of the vertical semiconductor channel is straight throughout the word line electrically conductive layers and the outer sidewall comprises a lateral protrusion at a level of the first select-level electrically conductive layer.

* * * * *